United States Patent
Ebert et al.

(10) Patent No.: US 9,766,557 B2
(45) Date of Patent: Sep. 19, 2017

(54) PATTERNING DEVICE SUPPORT, LITHOGRAPHIC APPARATUS, AND METHOD OF CONTROLLING PATTERNING DEVICE TEMPERATURE

(71) Applicants: ASML Holding N.V., Veldhoven (NL); ASML Netherlands B.V., Veldhoven (NL)

(72) Inventors: Earl William Ebert, Oxford, CT (US); Johannes Onvlee, s-Hertogenbosch (NL); Samir A. Nayfeh, Shrewsbury, MA (US); Mark Josef Schuster, Fairfield, CT (US); Peter A. Delmastro, New Milfort, CT (US); Christopher Charles Ward, Somerville, MA (US); Frank Johannes Jacobus Van Boxtel, Eindhoven (NL); Abdullah Alikhan, Wilton, CT (US); Daniel Nathan Burbank, Wilton, CT (US); Daniel Nicholas Galburt, Wilton, CT (US); Justin Matthew Verdirame, Cambridge, MA (US)

(73) Assignees: ASML Holding N.V., Veldhoven (NL); ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/438,376

(22) Filed: Feb. 21, 2017

(65) Prior Publication Data
US 2017/0160652 A1 Jun. 8, 2017

Related U.S. Application Data

(62) Division of application No. 14/439,359, filed as application No. PCT/EP2013/071933 on Oct. 21, 2013, now Pat. No. 9,632,433.

(Continued)

(51) Int. Cl.
*G03F 7/20* (2006.01)

(52) U.S. Cl.
CPC ...... *G03F 7/70875* (2013.01); *G03F 7/70341* (2013.01); *G03F 7/70716* (2013.01);
(Continued)

(58) Field of Classification Search
CPC ............ G03F 7/70808; G03F 7/70858; G03F 7/70716; G03F 7/70866; G03F 7/70875
See application file for complete search history.

(56) References Cited

U.S. PATENT DOCUMENTS

| 5,577,552 A | 11/1996 | Ebinuma et al. |
| 6,153,877 A | 11/2000 | Ashida |

(Continued)

FOREIGN PATENT DOCUMENTS

| JP | 02-132445 A | 5/1990 |
| JP | 09-022860 A | 1/1997 |

(Continued)

OTHER PUBLICATIONS

English-Language Abstract for Japanese Patent Publication No. 02-132445 A, published May 21, 1990; 1 page.
(Continued)

*Primary Examiner* — Michelle M Iacoletti
(74) *Attorney, Agent, or Firm* — Sterne, Kessler, Goldstein & Fox P.L.L.C.

(57) ABSTRACT

A patterning device support for controlling a temperature of a patterning device can include a movable component. The movable component can include a gas inlet for supplying a gas flow across a surface of the patterning device and a gas outlet for extracting the gas flow. The patterning device support can also include a gas flow generator coupled to a duct, for recirculating the gas flow from the gas outlet to the gas inlet.

13 Claims, 25 Drawing Sheets

Related U.S. Application Data

(60) Provisional application No. 61/720,628, filed on Oct. 31, 2012, provisional application No. 61/752,751, filed on Jan. 15, 2013, provisional application No. 61/768,125, filed on Feb. 22, 2013, provisional application No. 61/836,336, filed on Jun. 18, 2013.

(52) U.S. Cl.
CPC ...... *G03F 7/70808* (2013.01); *G03F 7/70858* (2013.01); *G03F 7/70866* (2013.01)

(56) References Cited

U.S. PATENT DOCUMENTS

| | | |
|---|---|---|
| 6,825,913 B1 | 11/2004 | Schuster et al. |
| 7,030,959 B2 | 4/2006 | Sogard |
| 8,767,172 B2 | 7/2014 | Ebihara et al. |
| 9,632,433 B2 | 4/2017 | Ebert et al. |
| 9,632,434 B2 | 4/2017 | Ebert et al. |
| 2002/0112784 A1 | 8/2002 | Tanaka et al. |
| 2009/0207394 A1 | 8/2009 | Shibazaki |
| 2010/0186942 A1 | 7/2010 | Phillips et al. |
| 2015/0241796 A1 | 8/2015 | Ebert et al. |
| 2015/0301456 A1 | 10/2015 | Ebert et al. |
| 2015/0355557 A1 | 12/2015 | Cuypers et al. |

FOREIGN PATENT DOCUMENTS

| | | |
|---|---|---|
| JP | 10-022196 A | 1/1998 |
| JP | 10-289874 A | 10/1998 |
| JP | 2004-063847 A | 2/2004 |
| JP | 2006-261163 A | 9/2006 |
| JP | 2006-269736 A | 10/2006 |
| JP | 2006-350315 A | 12/2006 |
| JP | 2008-124079 A | 5/2008 |
| JP | 2008-515219 A | 5/2008 |
| JP | 2008-130827 A | 6/2008 |
| JP | 2009-049168 A | 3/2009 |
| JP | 2010-080855 A | 4/2010 |
| JP | 2012-004157 A | 1/2012 |
| JP | 2012-028528 A | 2/2012 |
| JP | 2012-028530 A | 2/2012 |
| JP | 2012-033921 A | 2/2012 |
| WO | WO 2014/005780 A1 | 1/2014 |
| WO | WO 2014/067802 A1 | 5/2014 |

OTHER PUBLICATIONS

English-Language Abstract for Japanese Patent Publication No. 09-022860 A, published Jan. 21, 1997; 1 page.
English-Language Abstract for Japanese Patent Publication No. 10-022196 A, published Jan. 23, 1998; 1 page.
English-Language Abstract for Japanese Patent Publication No. 10-289874 A, published Oct. 27, 1998; 1 page.
English-Language Abstract for Japanese Patent Publication No. 2006-261163 A, published Sep. 28, 2006; 1 page.
English-Language Abstract for Japanese Patent Publication No. 2006-350315 A, published Dec. 28, 2006; 1 page.
English-Language Abstract for Japanese Patent Publication No. 2009-049168 A, published Mar. 5, 2009; 1 page.
English-Language Abstract for Japanese Patent Publication No. 2012-028528 A, published Feb. 9, 2012; 1 page.
English-Language Abstract for Japanese Patent Publication No. 2012-028530 A, published Feb. 9, 2012; 1 page.
English-Language Abstract for Japanese Patent Publication No. 2012-033921 A, published Feb. 16, 2012; 1 page.
International Search report directed to related International Patent Application No. PCT/EP2013/071933, mailed Mar. 25, 2014; 5 pages.
International Preliminary Report on Patentability and Written Opinion of the International Searching Authority directed to related International Patent Application No. PCT/EP2013/071933, issued May 5, 2015; 8 pages.
English-Language Abstract for Japanese Patent Publication No. 2004-063847 A, published Feb. 26, 2004; 1 page.
English-Language Abstract for Japanese Patent Publication No. 2010-080855 A, published Apr. 8, 2010; 1 page.
English-Language Abstract for Japanese Patent Publication No. 2012-004157 A, published Jan. 5, 2012; 1 page.
English-Language Abstract for Japanese Patent Publication No. 2008-124079 A, published May 29, 2008; 2 pages.
English-Language Abstract for Japanese Patent Publication No. 2008-130827 A, published Jun. 5, 2008; 2 pages.
Office Action directed to related Japanese Patent Publication No. 2015-538394, mailed Oct. 24, 2016; 9 pages.

PATTERNING DEVICE SUPPORT, LITHOGRAPHIC APPARATUS, AND METHOD OF CONTROLLING PATTERNING DEVICE TEMPERATURE

This application incorporates by reference in their entireties U.S. patent application. Ser. No. 14/439,359, 371(c) Date: Apr. 29, 2015, Int'l Appl. No. PCT/EP2013/071933, Int'l Appl. No. PCT/EP2013/071933, U.S. Provisional Application No. 61/768,125, filed Feb. 22, 2013; U.S. Provisional Application No. 61/752,751, filed Jan. 15, 2013; U.S. Provisional Application No. 61/720,628, filed Oct. 31, 2012; and U.S. Provisional Patent Application No. 61/836,336, filed Jun. 18, 2013, which are incorporated herein in their entirety by reference.

BACKGROUND

Field

Embodiments of the present invention generally relate to apparatuses for supporting a patterning device of a lithographic apparatus and, more particularly, to apparatuses and methods for controlling the temperature of a patterning device by flowing gas across a surface of the patterning device.

Related Art

A lithographic apparatus is a machine that applies a desired pattern onto a substrate, usually onto a target portion of the substrate. A lithographic apparatus can be used, for example, to manufacture integrated circuits (ICs). In such a case, a patterning device, for example, a mask or a reticle, can generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device can comprise a base material, for example, fused silica, that is substantially transparent to radiation, for example, deep ultraviolet radiation, and comprise a pattern made of a substantially non-transparent material, for example, chrome. Typically, the pattern absorbs the radiation, which generates heat. This heat causes the patterning device to expand and can adversely affect the air between the patterning device and proximal lens elements. For example, patterning device expansion can cause image distortion (such as overlay errors). Reticle or wafer alignment, magnification correction, feed forward systems for expansion prediction, and lens correction can partially address such image distortion. But these correction methods do not reduce imaging errors due to heating of the air between the patterning device and the lens element, so as tighter tolerances are required, these correction methods may not adequately address image distortion caused by the patterning device thermal expansion.

SUMMARY

In some embodiments, a system to control a temperature of a patterning device in a lithographic apparatus comprises a patterning device support. The patterning device support comprises a movable component, for example, a short stroke module, configured to support the patterning device and to move during operational use. The movable component defines a first opening adjacent a first end of a first surface of the patterning device. The patterning device support also comprises a gas inlet configured to provide a gas flow across the first surface of the patterning device. The gas inlet passes through the first opening of the movable component and has an opening adjacent the first end of the first surface of the patterning device. The patterning device support also comprises a gas outlet having an opening configured to extract the gas flow. The opening of the gas outlet is adjacent a second end of the first surface of the patterning device. The gas inlet and the gas outlet are configured such that the gas flow is substantially parallel to the first surface of the patterning device. The gas flow affects the temperature of the patterning device.

In some embodiments, a lithographic system comprises a patterning device support comprising a movable component, for example, a short stroke module, configured to support a patterning device. The system also includes a gas inlet disposed adjacent to and spaced from the movable component. The gas inlet is configured to supply a gas for forming a gas flow across a first surface of the patterning device to affect the temperature of the patterning device. The gas inlet is configured to move with the patterning device during operational use. The system also comprises a gas outlet disposed above the movable component and the patterning device. The gas outlet is configured to be stationary during operational use.

In some embodiments, a patterning device support for controlling a temperature of a patterning device includes a movable component configured to move the patterning device. The movable component can include a gas inlet for supplying a gas flow across a surface of the patterning device and a gas outlet for extracting the gas flow. The movable component can include a gas flow generator configured to recirculate the gas flow and a duct for passing the gas flow from the gas outlet to the gas inlet.

In some embodiments, a lithographic apparatus can include an illumination system configured to condition a radiation beam. The lithographic apparatus can also include a patterning device support for controlling a temperature of a patterning device. The patterning device support includes a gas inlet for supplying a gas flow across a surface of the patterning device and a gas outlet for extracting the gas flow. The patterning device support can also include a duct for recirculating the gas flow from the gas outlet to the gas inlet. The lithographic apparatus can also include a substrate table constructed to hold a substrate, and a projection system configured to project the patterned radiation beam onto a target portion of the substrate.

In some embodiments, a lithographic apparatus can include a patterning device support and movable component comprising a gas inlet configured to supply a gas flow across a surface of the patterning device, a gas outlet configured to extract the gas flow, and a duct configured to recirculate the gas flow from the gas outlet to the gas inlet. The lithographic apparatus can also include a controller configured to adjust a first characteristic of the gas flow to achieve a desired temperature of the patterning device.

In some embodiments, a method for controlling a temperature of a patterning device includes flowing a gas across a surface of the patterning device from a gas inlet of a patterning device support to a gas outlet of the patterning device support or of a fixed plate above the patterning device support. The method can also include recirculating the gas from the gas outlet to the gas inlet.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the disclosed embodiments will become more apparent from the detailed description set forth below when taken in conjunction with the drawings.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," "some embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
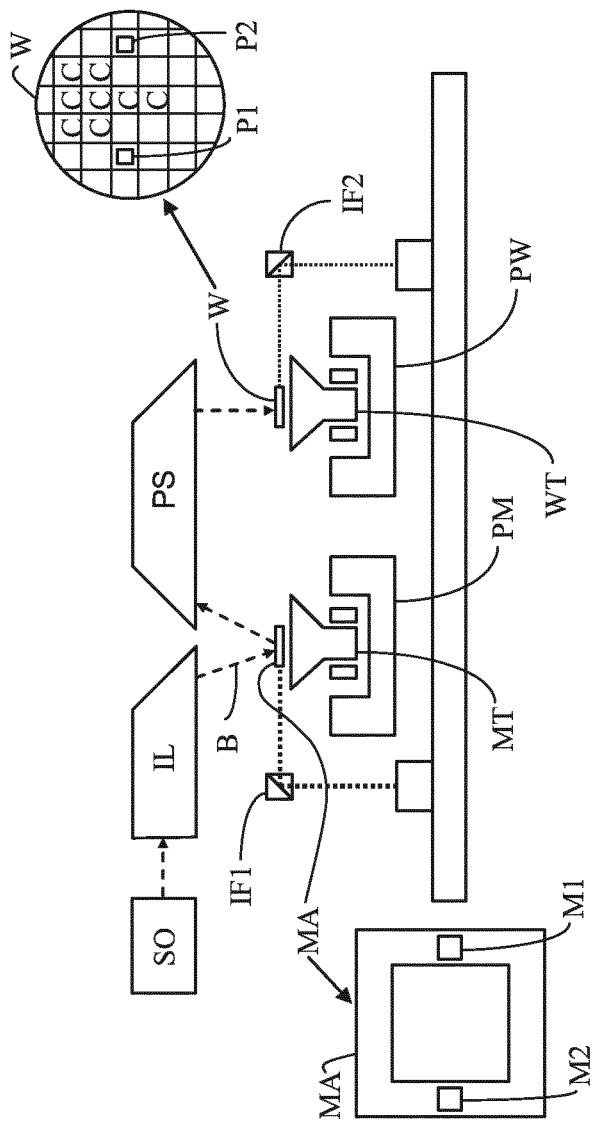
FIG. 1A is a schematic illustration of a reflective lithographic apparatus according to an embodiment.
Figure 1B:
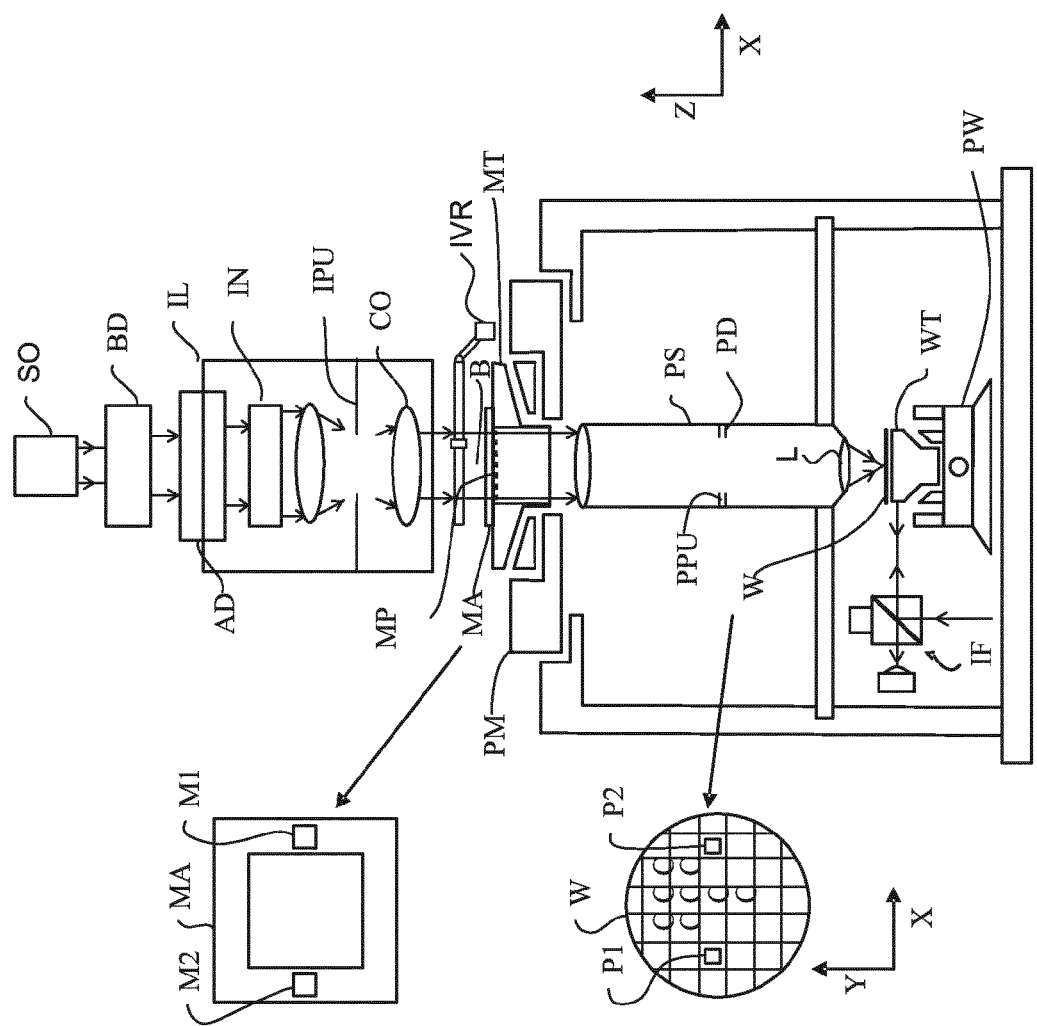
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising part of one or more dies) C of the substrate W. In lithographic apparatus 100, the patterning device MA and the projection system PS are reflective. In lithographic apparatus 100', the patterning device MA and the projection system PS are transmissive. In some embodiments, the projection system PS is catadioptric.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. IB) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure.

Referring to FIGS. 1A and IB, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. IB) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. IB) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. IB), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks PI, P2.

Referring to FIG. IB, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. IB) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools.

Further, the substrate can be processed more than once, for example, in order to create a multi-layer IC, so that the term substrate used herein can also refer to a substrate that already contains one or multiple processed layers.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2A:
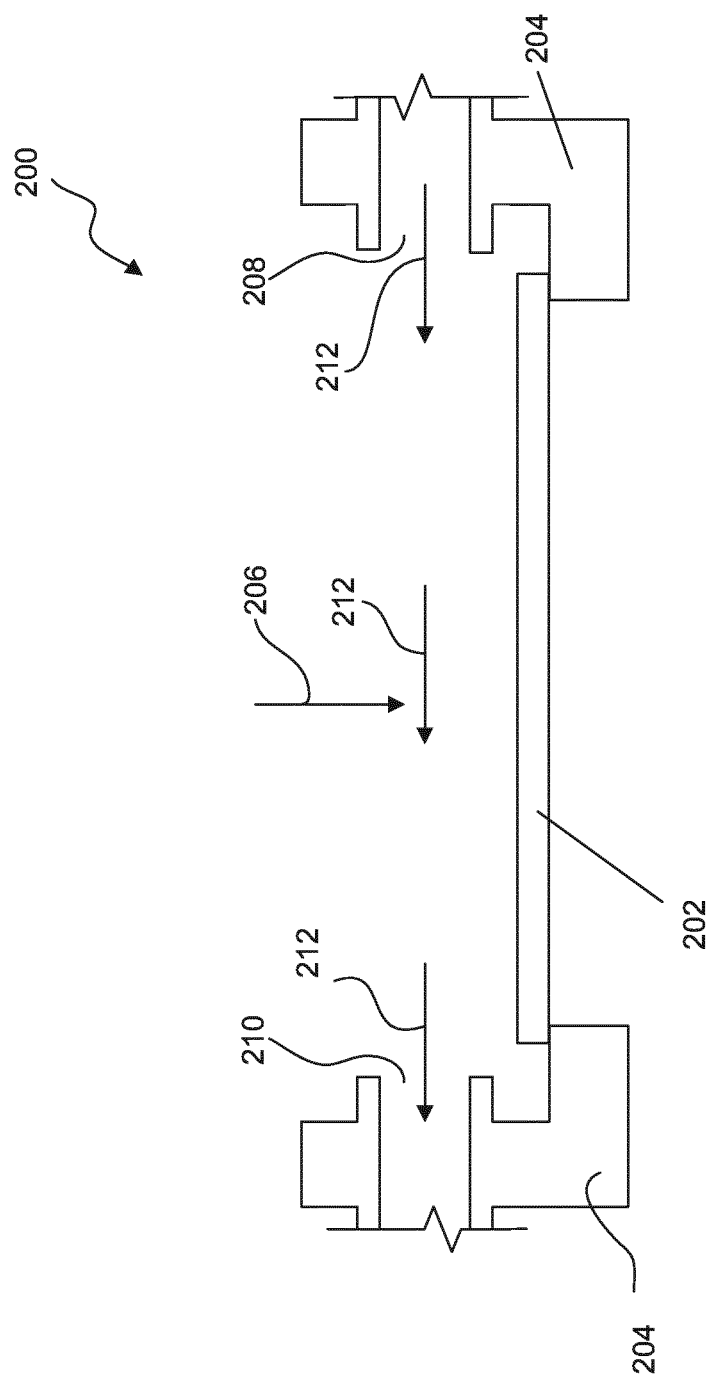
FIGS. 2A and 2B are schematic illustrations of a side view of a patterning device support and a fixed plate above the patterning device support according to embodiments.
Figure 2B:
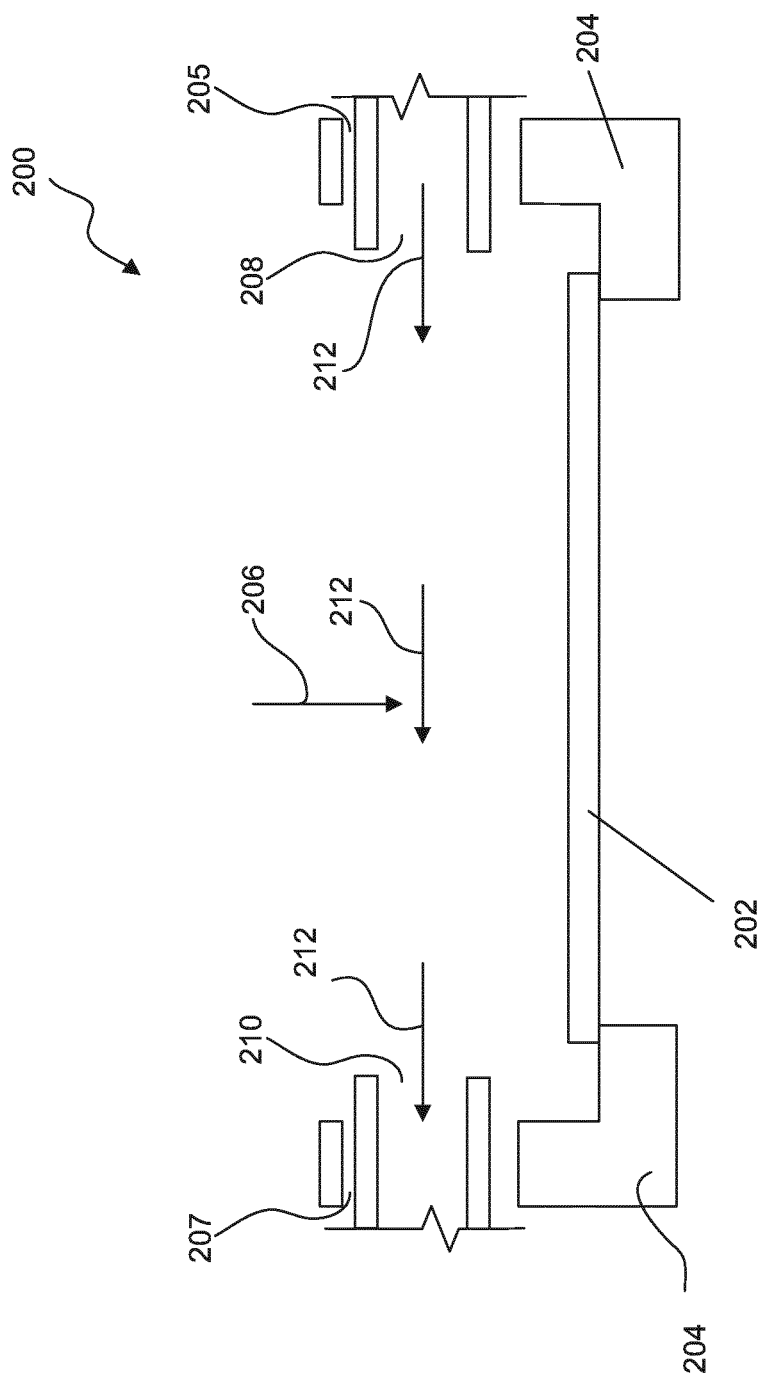

Exemplary Embodiments of Patterning Device Supports Configured to Control the Temperature of a Patterning Device FIGS. 2A and 2B illustrate a side view of a patterning device support 200 that is configured to control the temperature of a patterning device 202 according to embodiments. Patterning device support 200 can comprise a movable component 204, for example, a movable component of a reticle stage such as a short stroke module, that supports patterning device 202. Radiation 206, such as the radiation beam B discussed in FIGS. 1A and 1B above, is directed on patterning device 202. In some embodiments, patterning device 202 can be a reticle or other type of transmissive mask. As radiation 206 is incident on, and passes through, patterning device 202, patterning device 202 absorbs some energy from radiation 206, which can cause a temperature increase and an associated thermal expansion. [0065] Patterning device support 200 may include one or more gas inlets 208 on one side of patterning device support 200. Gas inlet 208 can be integral with movable component 204 as shown in FIG. 2A in some embodiments. In some embodiments, gas inlet 208 can be separate from component 204, for example, a separate nozzle that passes through an opening 205 defined by movable component 204 as shown in FIG. 2B. Gas inlet 208 is adjacent to an end of patterning device 202. In some embodiments, movable component 204 defines more than one opening 205 through which the nozzle may pass.

In some embodiments, gas inlet 208 is configured such that gas inlet 208 moves with patterning device 202 during operational use of a lithographic apparatus.

Movable component 204 may also include one or more gas outlets 210. In some embodiments, gas outlet 210 can be integral with movable component 204 as shown in FIG. 2A, or in some embodiments, gas outlet 210 can be separate from component 204, for example, a separate nozzle that passes through an opening 207 defined by movable component 204 as shown in FIG. 2B. Gas outlet 210 may be positioned at an opposing side of patterning device 202 relative to gas inlet 208. Gas outlet 210 may be adjacent an end of patterning device 202 opposite from the end of patterning device 202 at which gas inlet 208 is adjacent. In some embodiments, gas outlet 210 can be positioned at other suitable locations. Gas inlet 208 and gas outlet 210 may each be situated so as to be in close proximity, for example, adjacent to the same surface of patterning device 202, for example, a top surface of patterning device 202.

Gas inlet 208 and gas outlet 210 are positioned and configured such that a gas flow 212 travels across a surface of patterning device 202. In some embodiments, gas flow 212 travels from gas inlet 208 and substantially parallel to the surface of patterning device 202. Gas outlet 210 extracts gas flow 212 as gas flow 212 reaches the opposite side of patterning device 202. Extraction of gas flow 212 at gas outlet 210 may be active or passive.

Gas flow 212 modifies the temperature of patterning device 202. For example, gas flow 212 can reduce, increase, or maintain the temperature of patterning device 202. In some embodiments, gas flow 212 counters heating of patterning device 202 caused by radiation absorption, which reduces the thermal expansion of patterning device 202 and heating of the gas around patterning device 202. This reduction in thermal expansion of patterning device 202 and in the temperature of the gas around patterning device 202 reduces the image distortion. In some embodiments, gas flow 212 maintains patterning device 202 at or near 20° C. at atmospheric pressure. Skilled artisans will appreciate that other target temperatures are possible and/or may be more desirable for a given application. In some embodiments, one or more characteristics of gas flow 212, for example, temperature, pressure, or flow rate, may be dynamically adjusted to achieve a desired temperature of patterning device 202. The desired temperature of patterning device 202 can be static or dynamic, and uniform or non-uniform. In some embodiments, the gas forming gas flow 212 comprises helium or consists essentially of helium. Helium may provide a 40-50% improvement in the cooling of patterning device 202 over other gases at the same velocity. This improvement is due, in part, to helium having a thermal conductivity that is about six times greater than conventional gas (0.026 for gas vs. 0.148 for helium.) In some embodiments, gas flow 212 comprises an extremely clean dry gas or air. In some embodiments, gas flow 212 can be temporarily and selectively stopped while patterning device 202 is loaded on or unloaded from patterning device support 200 to avoid disturbing the loading process. In some embodiments, gas flow 212 can be temporarily and selectively stopped when no cooling of patterning device 202 is required. In some embodiments, the flow of gas flow 212 through gas outlet 210 is stopped when the flow of gas flow 212 through gas inlet 208 is stopped. In some embodiments, the flow of gas flow 212 may be stopped across the surface of the patterning device 202 when loading or unloading the patterning device 202 on a movable component such as the patterning device support 200 of a lithographic apparatus.

In some embodiments (not shown), gas inlet 208 and gas outlet 210 may be positioned to cause gas flow 212 to flow across a bottom surface of patterning device 202.

In some embodiments (not shown), in addition to gas inlet 208 in close proximity to the top surface of patterning device 202, an additional gas inlet may be integrated with patterning device support 200 in close proximity to the bottom surface of patterning device 202, with corresponding gas outlets in close proximity to the top and bottom surfaces of patterning device 202. This configuration creates dual parallel flows of gas across the top and bottom surfaces of patterning device 202.

In some embodiments, patterning device 202 is a reflective patterning device, as discussed with respect to FIG. 1A above (not shown in FIG. 2). Radiation beam 206 is still incident on patterning device 202 but would be reflected from patterning device 202. In such circumstances, patterning device 202 may still be subject to heating and degrading effects from the resulting thermal expansion of patterning device 202 and the heating of the gas around patterning device 202. Patterning device support 200 may still comprise gas inlet 208 and gas outlet 210 positioned within close proximity to a surface of patterning device 202, as discussed above.

Figure 3:
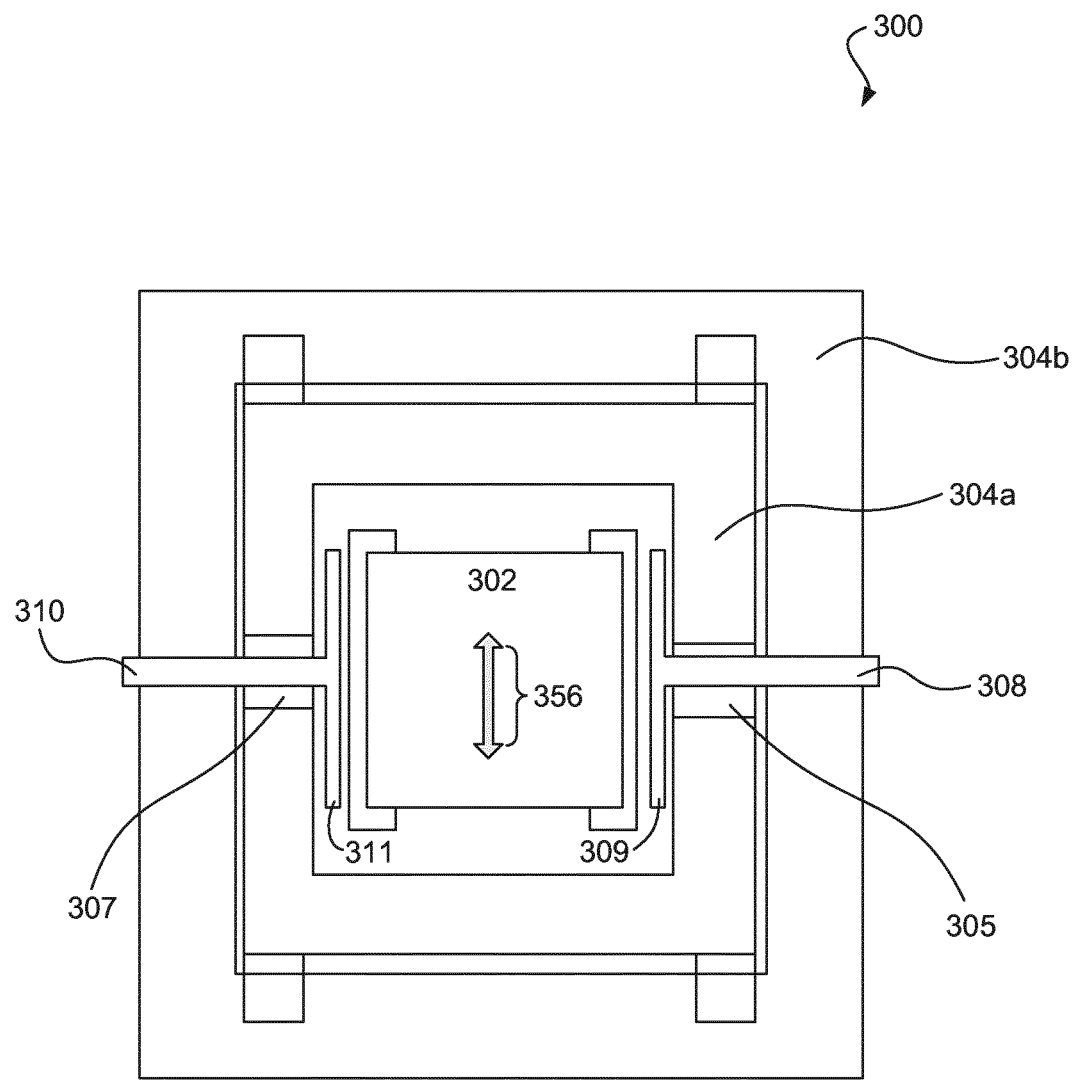
FIG. 3 is a schematic illustration of a top view of a patterning device support according to an embodiment.

In some embodiments, as explained below, gas flow 212 may be extracted by gas outlet 210 and recirculated back to gas inlet 208.

illustrates a top view of a patterning device support 300 according to an embodiment of the invention. Patterning device support 300 includes similar components as the above described patterning device supports. These similar components are similarly numbered and are only described to the extent they may differ or are helpful in explaining the disclosed embodiments. In FIG. 3, patterning device support 300 may include a short stroke module 304a and a long stroke module 304b, as discussed above with respect to FIGS. 1A and 1B. A gas inlet 308 may be integrated with, or coupled to, long stroke module 304b. Gas inlet 308 may include a gas supply nozzle 309, which is positioned proximate to a surface of a patterning device 302. A gas outlet 310 may be integrated with, or coupled to, long stroke module 304b at an opposing side of patterning device 302. Gas outlet 310 may include a gas extractor nozzle 311, which is positioned proximate to the same surface of patterning device 302 as gas supply nozzle 309.

As depicted in FIG. 3, gas supply nozzle 309 and gas extractor nozzle 311 are each approximately equal in length to the length of patterning device 302. In this configuration, a gas flow, such as gas flow 212 from FIG. 2, can adequately reach approximately the entire surface of patterning device 202. Gas supply nozzle 309 and gas extractor nozzle 311 may be longer, or shorter, than the length of patterning device 302. Gas supply nozzle 309 may be longer, shorter, or the same length as gas extractor nozzle 311.

Gas inlet 308 may extend through short stroke module 304a via an opening 305 defined by short stroke module 304a. Gas inlet 308 may be separated from short stroke module 304a. In a similar manner, gas outlet 310 may extend through short stroke module 304a via an opening 307 defined by short stroke module 304a. Gas outlet 310 may be separated from short stroke module 304a. Openings 305 and 307 may also be referred to as gaps, ports, or holes through a portion of short stroke module 304a. Openings 305 and 307 may be wide enough to allow short stroke module 304a to accurately position (such as movement along line 356) patterning device 302 with respect to a substrate. The length of openings 305 and 307 may prevent gas inlet 308 or gas outlet 310 from interfering with movement of short stroke module 304a or contacting short stroke module 304a. As a result, any dynamic impact on short stroke module 304a from gas inlet 308 and gas outlet 310 with patterning device support 300 may generally be minimized.

Additionally, dynamic impact of the gas flow across patterning device 302 may be minimized because both nozzles 309 and 311 are substantially stationary with respect to patterning device 302 (except for the fine positioning performed by short stroke module 304a). The positioning of gas supply nozzle 309 and gas extractor nozzle 311 may keep the gas flow fixed on patterning device 302 and minimizes any dynamic disturbances to either patterning device 302 or patterning device support 300. For example, because gas supply nozzle 309 and gas extractor nozzle 311 may both move with long stroke module 304b, there is minimal relative motion of nozzles 309 and 311 with respect to patterning device 302 and patterning device support 300. As a result, the gas flow from gas supply nozzle 309 may not cause a transient force on patterning device 302 as the gas flow passes across a surface of patterning device 302. Further, because the gas flow is extracted by gas extractor nozzle 311 before the gas flow may reach a side of short stroke module 304a, any net force applied to short stroke module 304a may be minimized.

Figure 4:
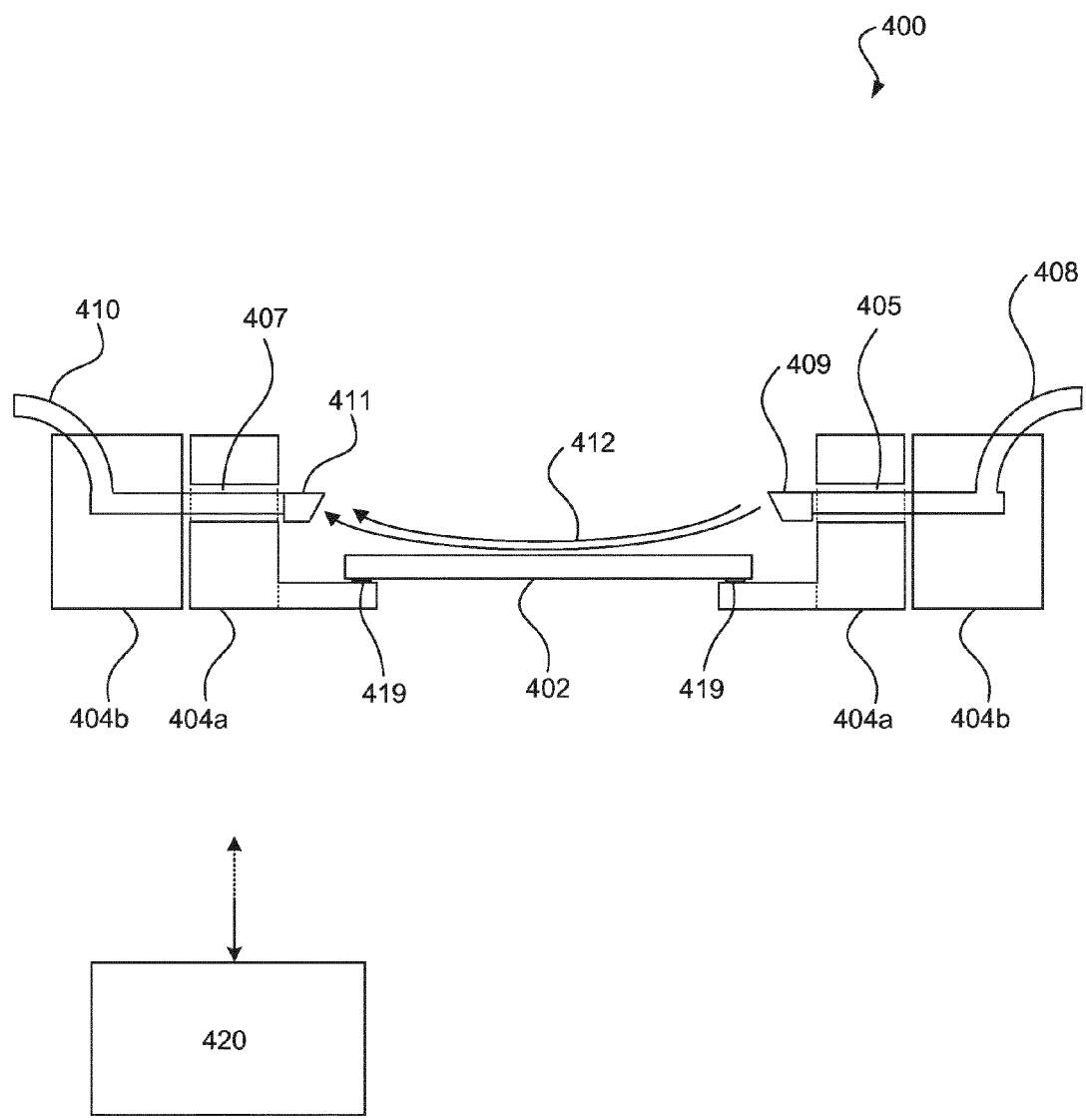
FIG. 4 is a schematic illustration of a side view of a patterning device support according to an embodiment.

FIG. 4 illustrates a side view of a patterning device support 400 according to an embodiment. Patterning device support 400 includes similar components as the above described patterning device supports. These similar components are similarly numbered and are only described to the extent they may differ or are helpful in explaining the disclosed embodiments. A gas inlet 408 and a gas outlet 410 may be integrated with, or coupled to, a long stroke module 404b. When integrated with long stroke module 404b, gas inlet 408 extends through one side of a short stroke module 404a via opening 405, and gas outlet 410 extends through another, opposite side of short stroke module 404a via opening 407. This configuration may allow short stroke module 404a to accurately position a patterning device 402 with respect to a substrate without causing gas inlet 408 or gas outlet 410 to interfere with movement of short stroke module 404a.

A gas supply nozzle 409 may be positioned proximate to a surface of patterning device 402 adjacent one end of patterning device 402 so as to cause a gas flow 412 across the surface toward a gas extractor nozzle 411 of gas outlet 410. Gas extractor nozzle 411 may be positioned proximate to the same surface of patterning device 402 at the opposing end of patterning device 402 to extract gas flow 412. As gas flow 412 passes across the surface of patterning device 402, gas flow 412 may remove heat, for example, heat generated by a beam of radiation incident upon patterning device 402, as discussed above with respect to FIGS. 2 and 3. Gas flow 412 may change the temperature of patterning device 402 or otherwise maintain a constant temperature of patterning device 402.

Nozzles 409 and 411 may have any suitable shape, size, or configuration. In some embodiments, nozzles 409 and 411 may each be a long tube with a plurality of holes substantially facing the surface of patterning device 402 through which gas flow 412 may exit (nozzle 409) and enter (nozzle 411). For example, the holes may be aimed at an angle that is near-parallel but slightly tilted toward the surface of patterning device 402. In some embodiments, nozzles 409 and 411 may have a plurality of holes parallel to the surface of patterning device 402. In some embodiments, nozzles 409 and 411 may each have a long tube with a plurality of individual nozzles facing the surface of patterning device 402, which may more specifically direct and influence the manner in which gas flow 412 passes across the surface of patterning device 402. These nozzle configurations are exemplary only. A skilled artisan will appreciate that there are other nozzle configurations possible to provide gas flow 412 across the surface of patterning device 402 without departing from the spirit and scope of the embodiments of the present disclosure.

Patterning device support 400 may also dynamically adjust the temperature of patterning device 402 by changing different characteristics of gas flow 412. In some embodiments, patterning device support 400 includes one or more temperature sensors 419. Temperature sensors 419 may be positioned at different locations and have different configurations with respect to patterning device 402. For example, temperature sensors 419 may be attached to patterning device 402, integrated with short stroke module 404b, or located a small distance from one or more locations of patterning device 402. A controller 420, for example, a processor, may be configured to receive signals from temperature sensors 419 that indicate the temperature at one or more locations of patterning device 402. Temperature sensor(s) 419 may be positioned and configured to sense a temperature at a location within the system, for example, the temperature of patterning device 402, the temperature of gas flow 412 entering the environment containing pattering device 402, the temperature of gas flow 412 exiting the environment containing patterning device 402, the temperature of the gas in the environment containing patterning device 402, or any combination of these temperatures.

Controller 420 may be configured to communicate with a cooling sub-system (not shown). In some embodiments, controller 420 dynamically adjusts the temperature of patterning device 402 by varying one or more characteristics of gas flow 412, for example, temperature, pressure, or flow rate of gas flow 412 to achieve a desired temperature of patterning device 402. The desired temperature of patterning device 402 can be static or dynamic, and uniform or non-uniform. Controller 420 may vary the flow rate of gas flow 412 at a plurality of exits in gas supply nozzle 409, depending on the configuration of nozzle 409 as discussed above.

In some embodiments, gas supply nozzle 409 may additionally include a temperature control element, for example, a heat exchanger, that is configured to change the temperature of gas flow 412 as it exits gas supply nozzle 409. This temperature control element may be, for example, one or more heaters attached to or integrated with gas supply nozzle 409. This temperature control element may be located at other locations, for example, at locations upstream of gas supply nozzle 409. Controller 420 may additionally dynamically adjust the temperature of gas flow 412 by a different amount at a plurality of exits in gas supply nozzle 409, depending on the configuration of nozzle 409 as discussed above.

Additionally, patterning device support 400 may control the temperature of patterning device 402 by a combination of varying the flow rate of gas flow 412 and a temperature of gas flow 412. In some embodiments, controller 420 may also be configured to adjust one or more characteristics of gas flow 412 based on the status of the lithographic apparatus. For example, controller 420 may decrease the velocity and/or volume of gas flow 412 when the system is not imaging a substrate, and increase the velocity and/or volume of gas flow 412 when the system is imaging a substrate. The skilled artisan will recognize that other variations of control are also possible that fall within the scope of the embodiments of the present disclosure.

Figure 5A:
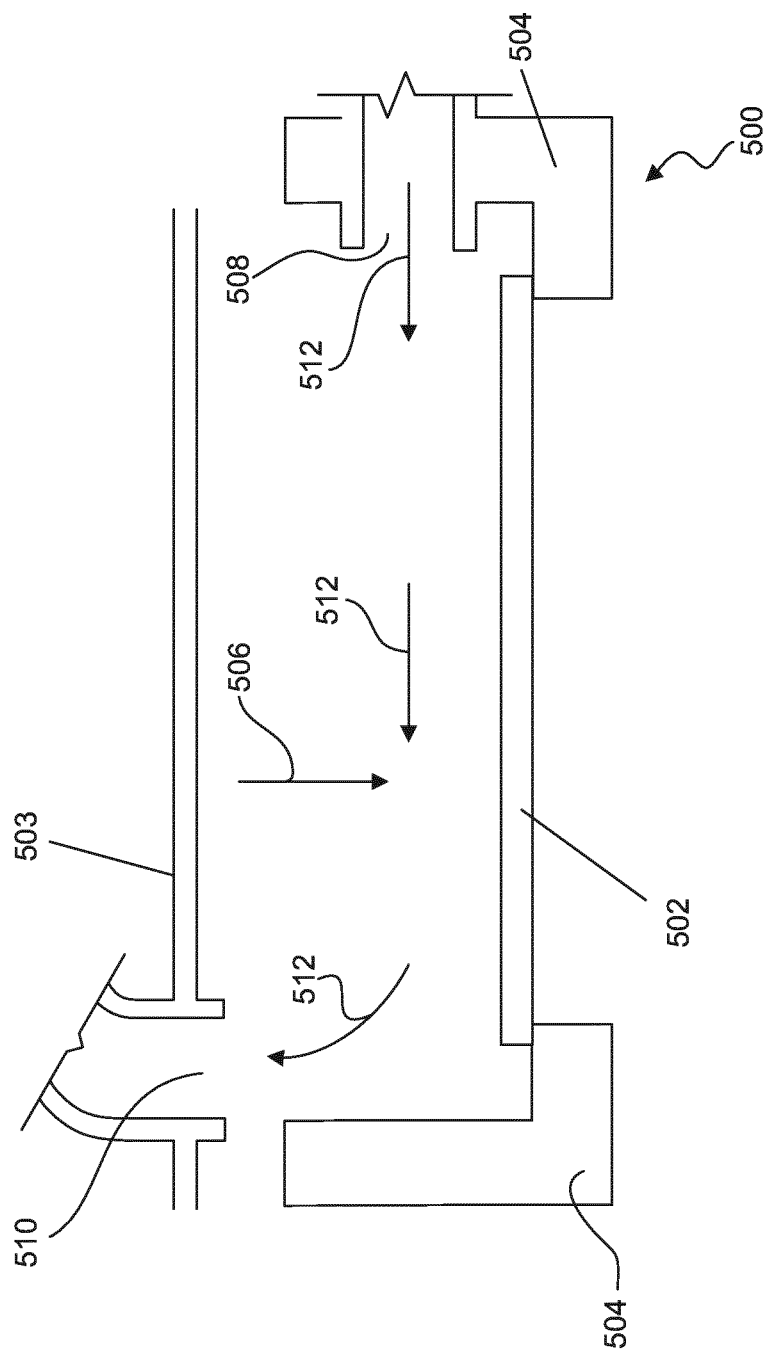
FIGS. 5A and 5B are schematic illustrations of a side view of a patterning device support according to embodiments.
Figure 5B:
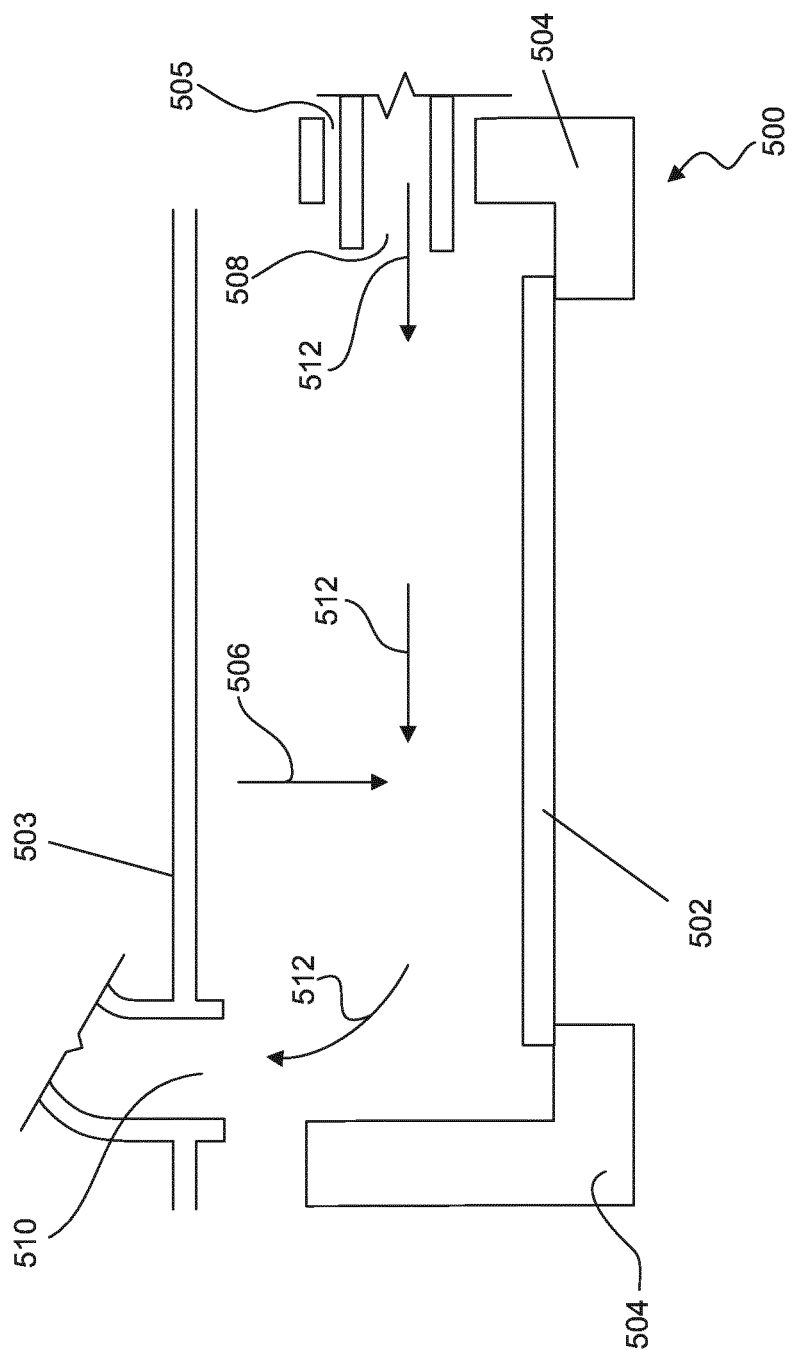

FIGS. 5A and 5B illustrate a side view of a patterning device support 500 that is configured to control the temperature of a patterning device 502, and a fixed component 503 of a lithographic apparatus according to embodiments. Patterning device support 500 includes similar components as the above described patterning device supports. These similar components are similarly numbered and are only described to the extent they may differ or are helpful in explaining the disclosed embodiments. Patterning device support 500 may comprise a movable component 504, for example, a movable component of a reticle stage, that supports patterning device 502. Radiation 506, such as the radiation beam B discussed in FIGS. 1A and 1B above, is directed on patterning device 502. In some embodiments, patterning device 502 can be a reticle or other type of transmissive mask. As radiation 506 is incident on, and passes through, patterning device 502, patterning device 502 absorbs some energy from radiation 506, which can cause a temperature increase and an associated thermal expansion, as well as a heating of the gas around patterning device 502. In some embodiments, component 503 is a non-movable component of a lithographic apparatus, for example, a fixed purge plate. Fixed purge plate 503 may be, for example, about 1.5 mm above patterning device support 500. Fixed purge plate 503 may define, in part, a pressurized environment that contains clean gas in the area between patterning device 502 and a bottom surface of fixed purge plate 503. Gas outlet 510 may be positioned, for example, at an opening or port along a long axis of the scanning stage in plate 503. The long axis of the scanning stage may be along the direction of the movement 356 shown in FIG. 3, for example. In some embodiments, gas outlet 510 may extend to cover the full range of movement possible along the long axis of the scanning stage. In some embodiments which gas outlet 510 is positioned at fixed purge plate 503, gas outlet 510 remains stationary during operational use of the lithographic apparatus.

Patterning device support 500 may include a gas inlet 508. In some embodiments, gas inlet 508 may be integral with movable component 504 as shown in FIG. 5A. For example, movable component 504 may form or be directly coupled to a nozzle. In some embodiments, gas inlet 508 may be separate from component 504, for example, a separate nozzle that passes through an opening 505 defined by movable component 504 as shown in FIG. 5B. Component 503 may include a gas outlet 510. As shown in FIGS. 5A and 5B, gas outlet 510 may be integrated with or coupled to fixed purge plate 503 that is above patterning device 502. Gas outlet 510 may be positioned at an opposing side of patterning device 502 relative to gas inlet 508. Gas inlet 508 and gas outlet 510 may each be situated so as to be in close proximity, for example, adjacent to the same surface of patterning device 502, for example, a top side of patterning device 502.

Gas inlet 508 and gas outlet 510 are positioned to provide a gas flow 512 across a surface of patterning device 502. In FIGS. 5A and 5B, gas flow 512 travels from gas inlet 508 and across and substantially parallel to the top surface of patterning device 502. Gas outlet 510 extracts gas flow 512 as gas flow 512 reaches the opposite side of patterning device 502.

Gas flow 512 modifies the temperature of patterning device 502. For example, gas flow 512 can reduce, increase, or maintain the temperature of patterning device 502. In some embodiments, gas flow 512 counters heating of patterning device 202 caused by radiation absorption, which reduces the thermal expansion of patterning device 202 and heating of the gas around patterning device 202. This reduction in thermal expansion of patterning device 202 and in the temperature of the gas around patterning device 202 reduces the image distortion. In some embodiments, the characteristics of gas flow 512, for example, temperature, pressure, or flow rate, may be dynamically adjusted to achieve a desired temperature of patterning device 502. The desired temperature of patterning device 502 can be static or dynamic, and uniform or non-uniform. In some embodiments, the gas of gas flow 512 comprises helium or consists essentially of helium. In some embodiments, gas flow 512 comprises an extremely clean dry gas or air.

Gas flow 512 extracted by gas outlet 510 can be recirculated back to gas inlet 508 as discussed below.

Figure 6:
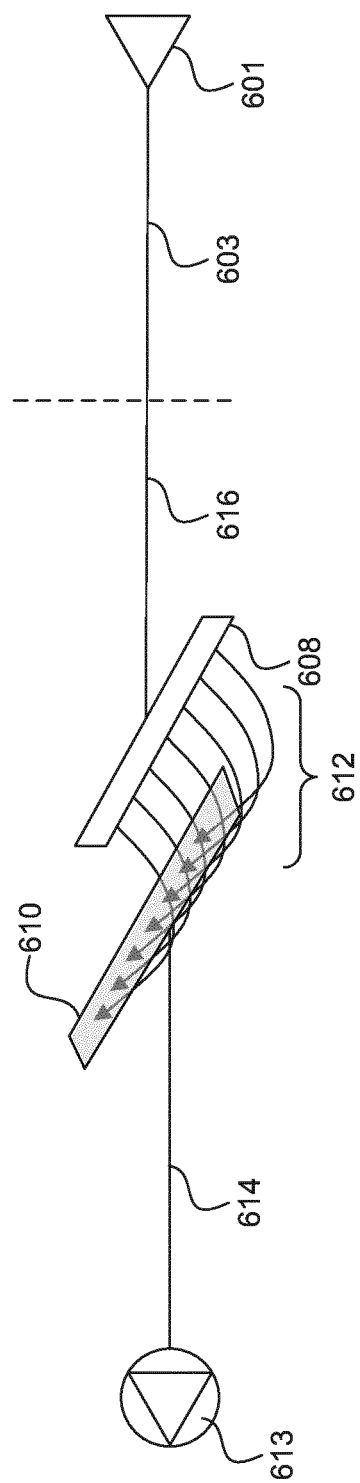
FIG. 6 is a schematic illustration of an exemplary infrastructure according to an embodiment.

FIG. 6 is a schematic illustration of an exemplary infrastructure according to an embodiment. In FIG. 6, a gas supply 601 supplies a gas. Gas supply 601 may supply, for example, extremely clean dry gas or air. In some embodiments, the gas from supply 601 may flow at a rate of about 20 normal liters per second. A skilled artisan will recognize that other gas flow rates and other gases are possible without departing from the scope of the present disclosure.

The infrastructure may also include a supply inflow duct 603 that transports the gas from supply 601 to one or more supply hoses 616 to a patterning device support of a lithographic apparatus. Supply hoses 616 may include, for example, five hoses of equal or varying diameter. In some embodiments, each supply hose 616 may have an inner diameter of about 10 mm. In some embodiments, the diameter of each supply hose 616 may be sized to create an overpressure, for example, an overpressure of several bars. In some embodiments, a restrictive member of a nozzle may create an overpressure. The overpressure may lower the velocity and create a good flow layer across a patterning device. Supply hoses 616 may be of any material, for example, polytetrafluoroethylene, that is clean or very clean and emits minimal molecular contamination, for example, outgassing, to the gas flow provided from supply 601. In some embodiments, supply hoses 616 may be made of polyurethane. Skilled artisans will recognize that other materials and diameters may also be used, as well as more or fewer hoses than five to bring the gas flow to one or more supply nozzles. Supply hoses 616 may be integrated with a system configured to bring water and gas to the patterning device support.

Supply hoses 616 may be connected to a gas inlet 608 at a movable component of the patterning device support. Gas inlet 608 may include one or more nozzles as discussed above. The gas from supply 601 is emitted from gas inlet 608 and flows across a surface of the patterning device as gas flow 612. In some embodiments, the surface of the patterning device is a top surface of a patterning device. In some embodiments, gas inlet 608 is tilted to direct gas flow 612 toward the surface of the patterning device and, in some embodiments, toward the center of the patterning device. Gas flow 612 may cool or otherwise maintain a constant temperature of the patterning device.

After gas flow 612 crosses the surface of the patterning device, a gas outlet 610 extracts gas flow 612. In some embodiments, gas outlet 610 is coupled to or integrated with a gas extraction slot in a fixed purge plate at an end of the patterning device opposite gas inlet 608, as discussed above with respect to FIGS. 5A and 5B. Gas outlet 610 may extend along a long axis of the patterning device support. The infrastructure may also include a fan 613 that facilitates extraction of gas flow 612.

After gas flow 612 is extracted at gas outlet 610, gas flow 612 may pass through an extraction hose 614. Extraction hose 614 may be, for example, about 50 mm in diameter. The diameter of extraction hose 614 can be sized to achieve a desired specific gas flow rate, for example, a gas flow rate of about 20 normal liters per second. The diameter of extraction hose 614 can also be sized to maintain the dynamics of gas flow 612 after extraction. Other diameters and flow rates are possible, as will be recognized by those skilled in the relevant arts. Positioning gas outlet 610 in a fixed purge plate, in contrast to being integrated with or coupled to a movable component of the pattering device support, may be advantageous in situations in which extraction hose 614 is of a significant diameter, for example, about 50 mm, which makes it difficult to extend extraction hose 614 close to the reticle stage as would be necessary for integrating or coupling to the long stroke module.

Fan 613 may be an existing fan already utilized in other aspects of the lithographic system or an additional, separate fan system, as will be recognized by those skilled in the relevant arts. In some embodiments, fan 613 creates a pressure difference that causes a flow from gas outlet 610 toward fan 613, for example, in a direction away from the surface of the patterning device.

Figure 21:
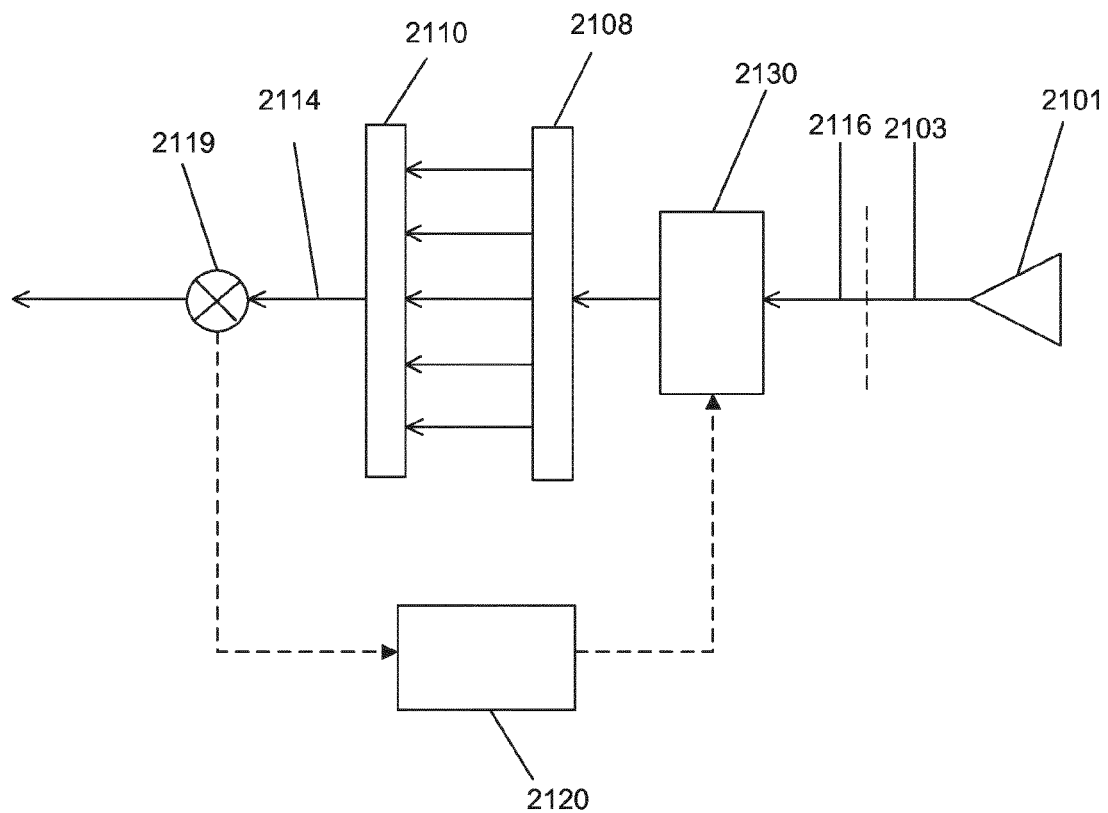
FIG. 21 is a schematic illustration of an exemplary infrastructure according to an embodiment.
Figure 22:
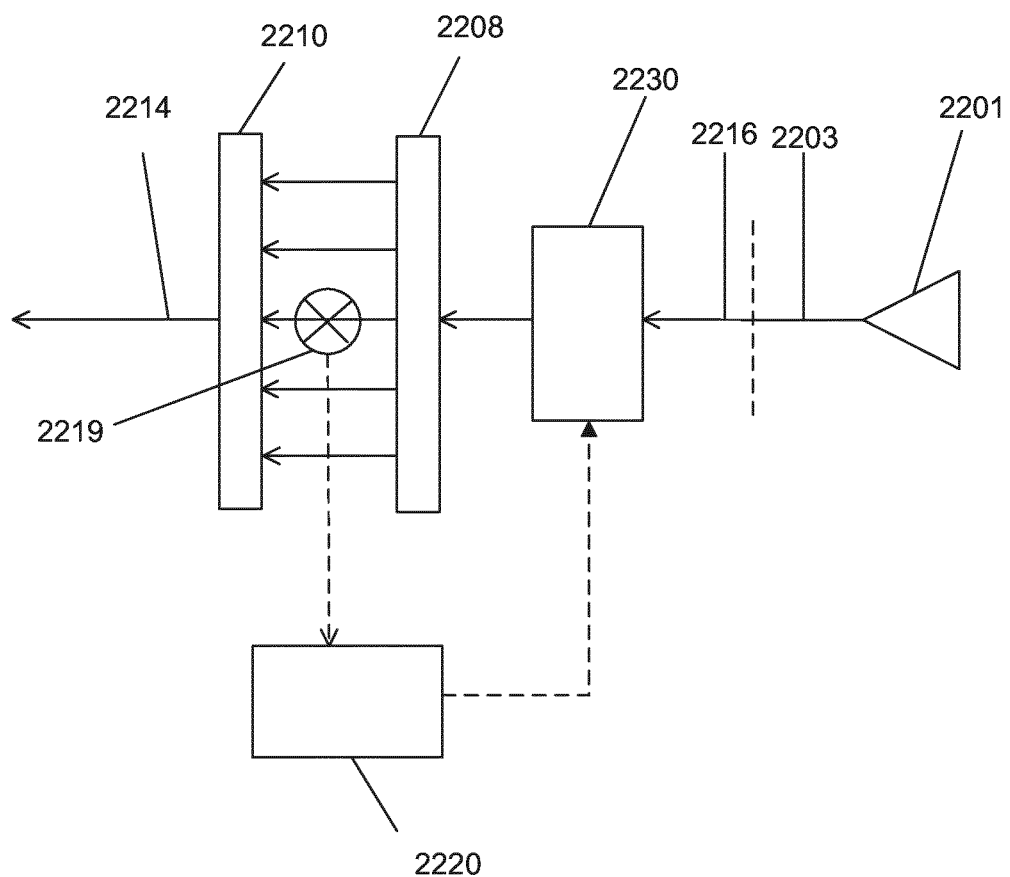
FIG. 22 is a schematic illustration of an exemplary infrastructure according to an embodiment.

FIGS. 21 and 22 are schematic illustrations of exemplary closed-loop control infrastructures according to embodiments. The infrastructures of FIGS. 21 and 22 include similar components as the above described infrastructure of FIG. 6. These similar components are similarly numbered and are only described to the extent they may differ. As shown in FIG. 21, a temperature control element 2130, for example, a heat exchanger, is operatively coupled between gas supply 2101 and gas inlet 2108. Temperature control element 2130 is configured to adjust temperature of gas supplied from gas supply 2101. A temperature sensor 2119 configured to determine a temperature of the gas may be positioned downstream from gas outlet 2110. The infrastructure can include a controller 2120 operatively coupled to temperature sensor 2119 and to temperature control element 2130. Controller 2120 is configured to receive a signal from temperature sensor 2119 and, based on the received signal, controller 2120 communicates with heat exchanger 2130 to adjust the temperature of gas flow being supplied by gas supply 2101. In FIG. 22, a temperature sensor 2219 is positioned between a gas inlet 2208 and a gas outlet 2210.

Although only one sensor 2119 and sensor 2219 is shown in FIGS. 21 and 22, more than one sensor 2119 and sensor 2219 may be used. Controllers 2120 and 2220 may also process other signals in addition to the signal(s) received from temperature sensors 2119 and 2219. For example, controllers 2120 and 2220 may process the expected amount of dose used during exposure of patterning devices 2102 and 2202, and controllers 2120 and 2220 may vary one or more characteristics of gas flows 2112 and 2213 based on the expected dose, for example, to optimize the control loop used during a feed forward mode.

In some embodiments (not shown), temperature sensors 2119 and 2219 are positioned in a nozzle at gas inlets 2108 and 2208. In such embodiments, the Joule-Thomson effect could be compensated for by knowing the pressure in the nozzle, for example, by using a pressure sensor in the nozzle or by design or calibration.

Temperature sensors 2119 and 2219 may be positioned at other suitable locations, for example, at inlets 2108 and 2208, at outlets 2110 and 2210, or upstream of inlets 2108 and 2208.

Figure 7A:
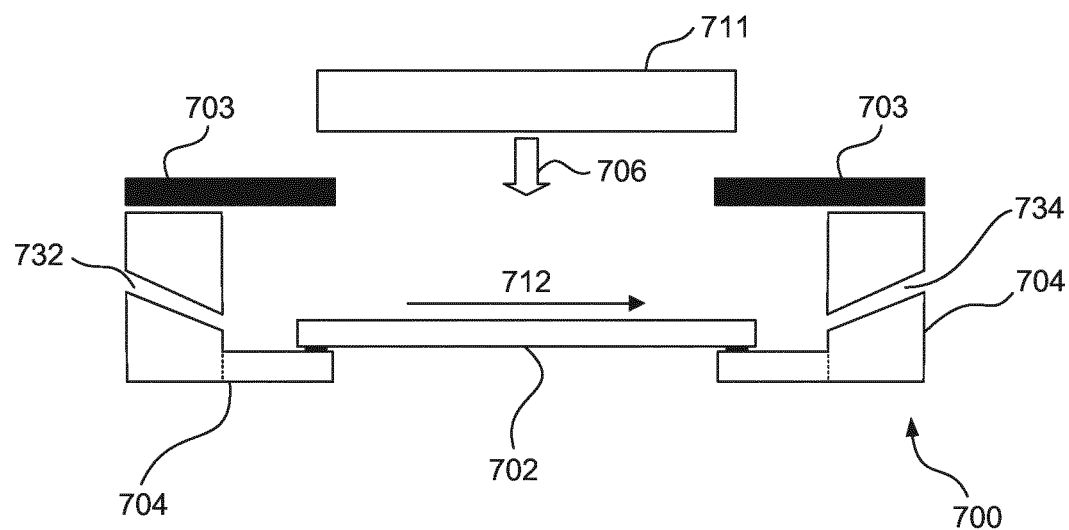
FIG. 7A is a schematic illustration of a side view of a patterning device support according to an embodiment.

FIG. 7A illustrates a patterning device support 700 according to an embodiment. Patterning device support 700 includes similar components as the above described patterning device supports. These similar components are similarly numbered and are only described to the extent they may differ or are helpful in explaining the disclosed embodiments. A movable component 704 of patterning device support 700, for example, a short stroke module, can define a first channel 732 on one side of a patterning device 702, and a second channel 734 on an opposing side of patterning device 702. As shown in FIG. 7A, this temperature control system does not require a gas supply. Rather, the temperature of a surface, for example, a top or bottom surface, of a patterning device 702 is controlled by generating a flow of gas through channel 732, across a surface of patterning device 702, and then through channel 734. Channels 732 and 734 may extend entirely through movable component 704 in some embodiments. Channels 732 and 734 may be positioned at opposite ends of moveable component 704 or substantially around an entire perimeter of moveable component 704. Moveable component 704 may be a short stroke module or a long stroke module in some embodiments. In some embodiments, channels 732 and 734 extend through both a long stroke module and a short stroke module. Movable component 704 may scan along an axis.

Patterning device 702 may rest upon patterning device support 700. As moveable component 704 moves, ambient gas around support 700 is forced through a leading channel, for example, channel 732 or channel 734. The shape and orientation of channels 732 and 734 may be designed so that gas flows substantially parallel across a surface of patterning device 702 as illustrated in FIG. 7A. For example, channels 732 and 734 may have a tapered geometry to direct the gas or include curved surfaces to aid in funneling the gas across the surface of patterning device 702. In one embodiment, channels 732 and 734 may be present both above and below patterning device 702 to direct gas substantially parallel and across both a top and bottom surface of patterning device 702. In some embodiments, channels 732 and 734 may only be present below patterning device 702 to direct gas substantially parallel and across the bottom surface of patterning device 702. The movement of gas across the surface(s) of patterning device 702 may control the temperature of patterning device 702. For example, flowing gas that is colder than patterning device 702 will lower the temperature of patterning device 702.

The lithographic apparatus may also include a plate 703 positioned above patterning device 702. Plate 703 may enclose, in part, an area between plate 703 and patterning device 702 to maintain the temperature of pattering device 702 and contain the gas flow in some embodiments. Plate 703 may be, for example, about 1.5 mm above the scanning stage of patterning device support 700. Plate 703 may include an opening to allow a beam of radiation 706 to impinge upon the surface of patterning device 702. Beam of radiation 706 may exit from an optical element 711, for example, a component of the illumination optics in a lithographic apparatus.

Figure 7B:
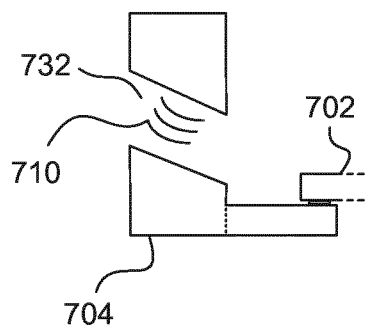
FIG. 7B is a schematic illustration of an enlarged portion of the patterning device support of FIG. 7A.

FIG. 7B illustrates an enlarged view of a channel 732 or 734 extending through movable component 704. An end of patterning device 702 is illustrated resting upon a surface of movable component 704. In some embodiments, a temperature control element 710, for example, a heat exchanger, is positioned within channel 732. Temperature control element 710 may control the temperature of the gas moving through channel 732. For example, temperature control element 710 may cool the gas before it flows across the surface of patterning device 702.

In some embodiments, temperature control element 710 may use rough cooling water (RCW) to cool the gas. The RCW may already be in use for cooling motors that control, for example, moveable component 704. Thus, the same RCW system being used for cooling other parts of patterning device support 700 may be used for cooling the gas within channel 732 as well. In some embodiments, the RCW system is designed such that the gas within channel 732 is cooled by the water before the water is used to cool other components, for example, the motors that control movable component 704.

In some embodiments, temperature control element 710 is a thermoelectric cooling device. For example, the thermoelectric cooling device can be a Peltier device that cools gas on one side of the device by an applied current. The current may be adjusted to control the temperature of the gas moving through channel 732. The heat transfer within channel 732 may be doubled or tripled depending on whether temperature control element 710 is used.

Figure 8:
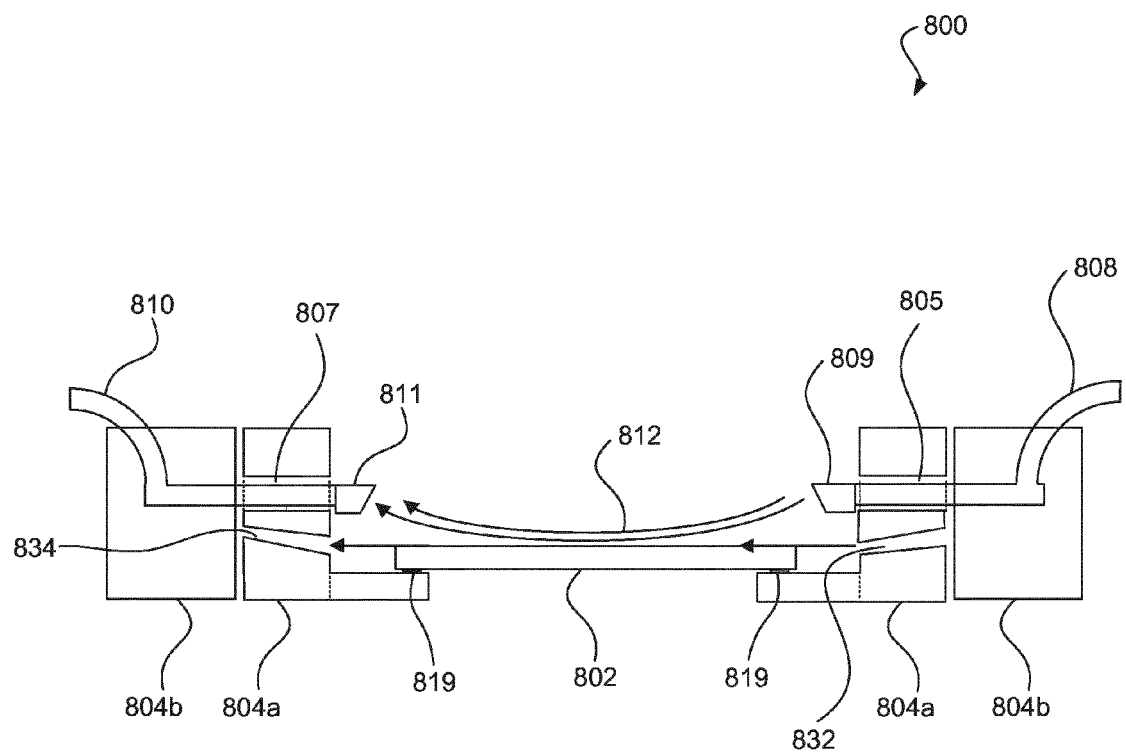
FIG. 8 is a schematic illustration of a side view of a patterning device support according to an embodiment.

FIG. 8 illustrates a patterning device support 800 according to an embodiment. Patterning device support 800 includes similar components as the above described patterning device supports. These similar components are similarly numbered and are only described to the extent they may differ or are helpful in explaining the disclosed embodiments. A movable component 804a of patterning device support 800, for example, a short stroke module, can define a first channel 832 on one side of a patterning device 802, and a second channel 834 on an opposing side of patterning device 802, as described above with reference to FIGS. 7A and 7B. As shown in FIG. 8, the temperature control system may also use a gas inlet 808 and a gas outlet 810 as described above with reference to FIG. 4. Gas flow 812 across the surface of patterning device 802 is generated by a combination of gas supplied by gas inlet 808 and gas passing through channel 832 generated by movement of movable component 804a.

Figure 9:
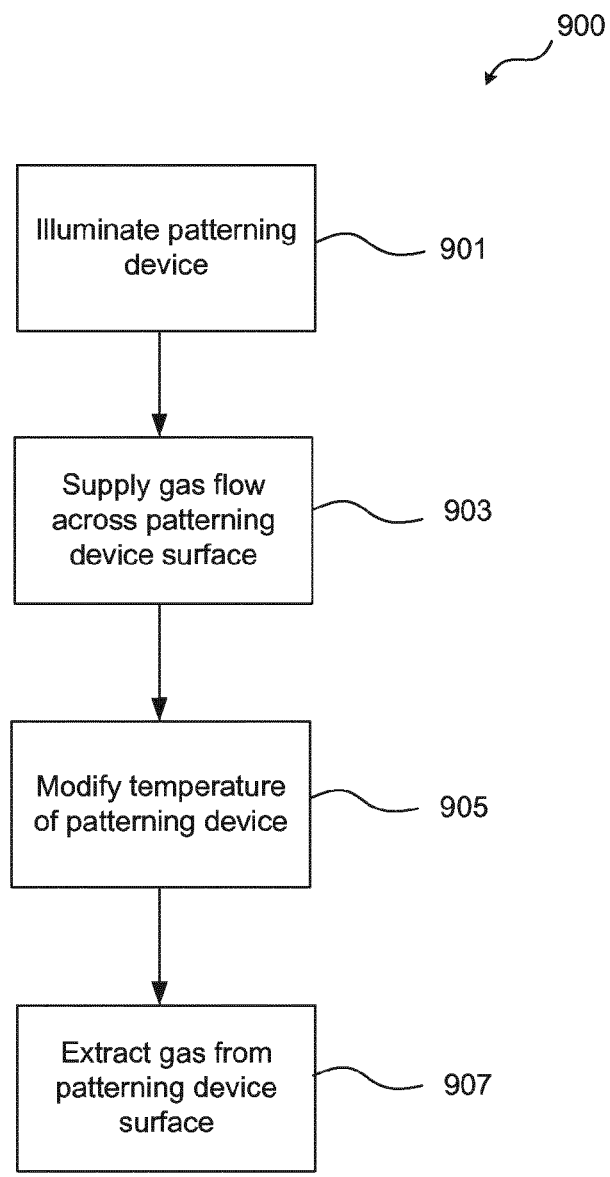
FIG. 9 is a flow diagram of a method of cooling a patterning device according to an embodiment.

Exemplary Embodiments of Methods of Controlling the Temperature of a Patterning Device FIG. 9 is a flow diagram of a method 900 for controlling the temperature of a patterning device according to an embodiment. It is to be appreciated that operations in method 900 may be performed in another order, and that not all operations shown may be needed. Method 900 starts at step 901 when, for example, the patterning device is illuminated with a radiation beam. The patterning device may be, for example, a reticle. At step 903, a gas flow is supplied across a surface of the patterning device. In some embodiments, the gas flow is substantially parallel to a surface, for example, a top surface, of the patterning device. In some embodiments, the gas flows across a bottom surface of the patterning device. In some embodiments, the gas flow is introduced by a gas inlet, for example, as discussed above with respect to FIGS. 2-6 and 8, or by a channel defined by a movable component as discussed above with respect to FIGS. 7A, 7B, and 8.

At step 905, the gas flow modifies or maintains the temperature of the patterning device, for example, because the gas flow is at a lower temperature. A characteristic of the gas flow, for example, the velocity, volume, and/or temperature, can be adjusted to variably affect the temperature of the patterning device, as will be recognized by the skilled artisan. In some embodiments, the channeled gas includes helium.

At step 907, the gas flow is extracted from the surface of the patterning device at an opposite end of the patterning device. In some embodiments, the gas flow is extracted by a gas outlet, for example, as discussed above with respect to FIGS. 2-6, or by a channel defined by a movable component as discussed above with respect to FIGS. 7A, 7B, and 8.

In some embodiments, the gas flow is continually supplied while the lithographic apparatus is in operation. In some embodiments, the gas flow is continually supplied while the lithographic apparatus is in operation such that the temperature of the patterning device is constantly maintained. In some embodiments, the temperature of the patterning device is maintained at or about a target temperature, for example, about 22° C.

Figure 10:
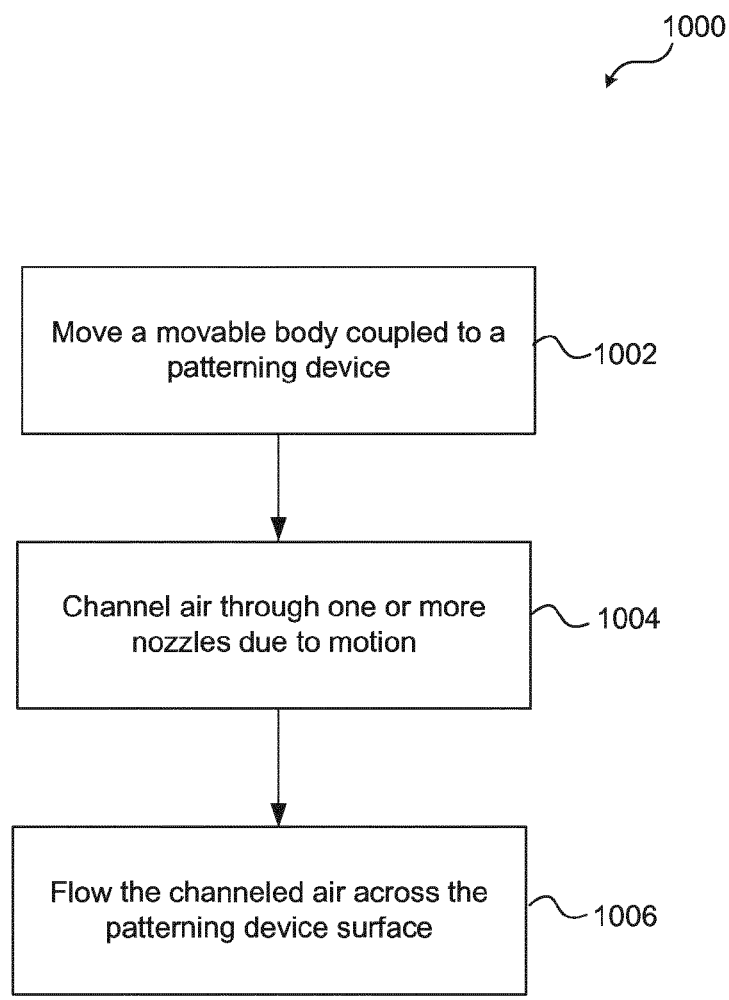
FIG. 10 is a flow diagram of a method of cooling a patterning device according to an embodiment.

FIG. 10 is a flow diagram of a method 1000 for controlling the temperature of a patterning device according to an embodiment. It is to be appreciated that operations in method 1000 may be performed in another order, and that not all operations shown may be needed. As shown in FIG. 10, method 1000 may begin at step 1002 by moving a moveable component that is coupled to a patterning device. The patterning device may rest upon a surface of the moveable component that is either attached to or part of the movable component. The movable component may move along an axis, for example, during a scanning motion.

Method 1000 continues with step 1004 at which gas is pushed through one or more channels by movement of the movable component as shown in FIGS. 7A-7B. The one or more channels may extend through the moveable component. The one or more channels may be positioned on opposite sides of the movable component along a first axis such that gas is pushed through the channels on the opposite sides when the moveable body moves along the first axis. For example, gas may be pushed through the channels on one side of the moveable component when the moveable component moves in a first direction along the first axis, and the gas may be pushed through the channels on the opposite side of the moveable component when the moveable body moves in the opposite direction from the first direction. The channeled gas may further be cooled via a temperature control element, such as, for example, an RCW system or thermoelectric cooling device.

At step 1006, the channeled gas flows across a surface of the patterning device. In some embodiments, the gas flow is substantially parallel to the surface of the patterning device. The flowing of the gas may cause a temperature change in the patterning device, for example, a drop in the temperature of the patterning device. In some embodiments, the channeled gas includes helium.

Figure 11:
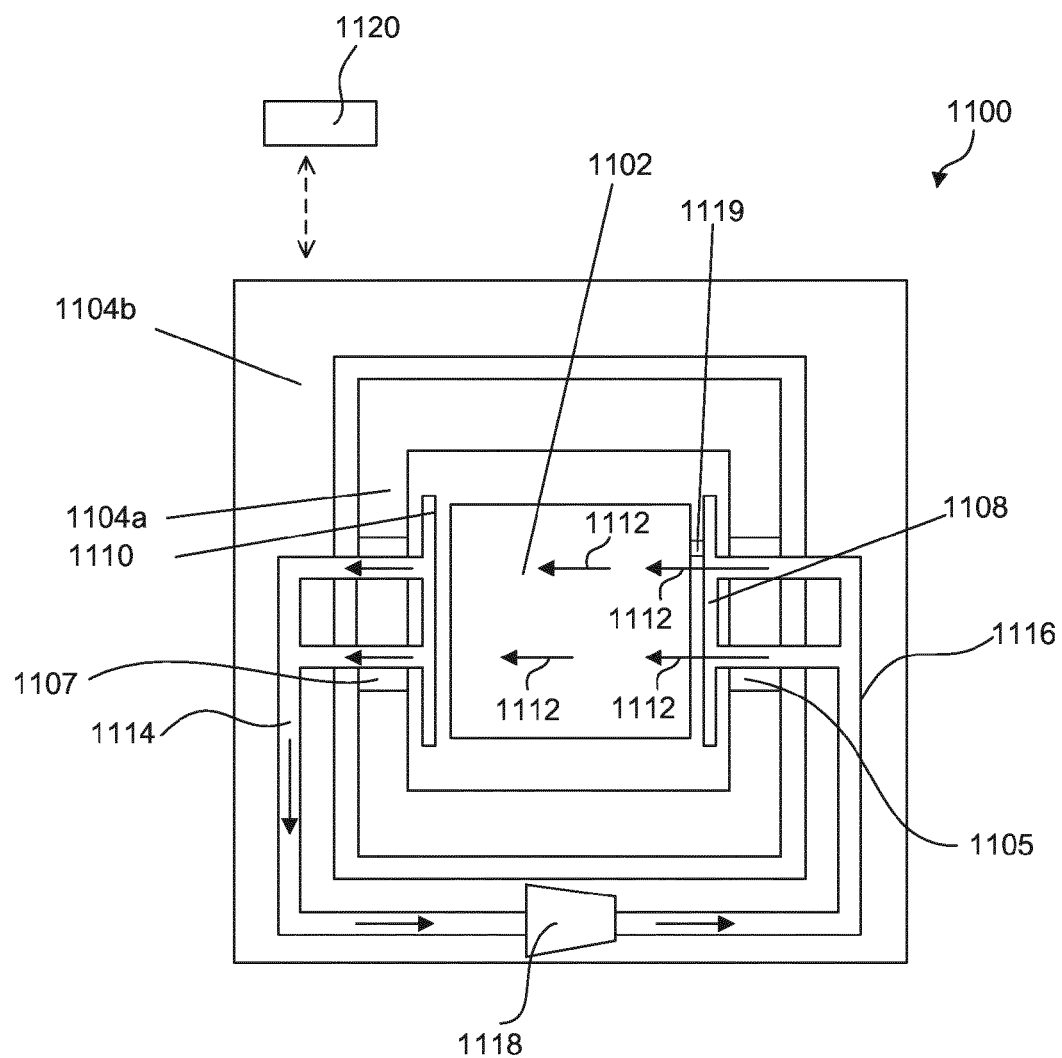
FIG. 11 is a schematic illustration of a top view of a patterning device support according to an embodiment.

Exemplary Embodiments of Patterning Device Supports That Recirculate the Gas Flow FIG. 11 illustrates a top view of a patterning device support 1100 configured to control the temperature of a patterning device 1102 according to an embodiment. Patterning device support 1100 includes similar components as the above described patterning device supports. These similar components are similarly numbered and are only described to the extent they may differ or are helpful in explaining the disclosed embodiments. Patterning device support 1100 can comprise a first movable component 1104a and a second movable component 1104b, for example, the short-stroke module and the long-stroke module as discussed above with respect to FIGS. 1A and 1B. Patterning device support 1100 can comprise a gas inlet 1108 positioned proximate to a surface of patterning device 1102. Patterning device support 1100 can also include gas outlet 1110 positioned proximate to the same surface of patterning device 1102 as gas inlet 1108. In some embodiments, gas inlet 1108, gas outlet 1110, first movable component 1104*a*, and second movable component 1104*b* can be configured as described in U.S. Provisional Patent Application Nos. 61/768,125, filed Feb. 22, 2013; 61/752,751, filed Jan. 15, 2013; and 61/720,628, filed Oct. 31, 2012, which are incorporated herein in their entireties by reference. In some embodiments, patterning device support 1100 can be configured as described in U.S. Provisional Patent Application Nos. 61/824,695, filed May 17, 2013; and 61/767,060, filed Feb. 20, 2013, which are incorporated herein in their entireties by reference. In some embodiments, patterning device support 1100 can be configured as described in U.S. Provisional Patent Application No. 61/767,184, filed Feb. 20, 2013, which is incorporated herein in its entirety by reference.

As depicted in FIG. 11, gas inlet 1108 and gas outlet 1110 are elongated, and each is approximately equal in length to the length of patterning device 1102 in some embodiments. In such embodiments, gas flow 1112 is able to adequately flow over substantially the entirely surface of patterning device 1102. As will be recognized by the skilled artisan, gas inlet 1108 and gas outlet 1110 can be longer or shorter than the length of patterning device 1102 without departing from the general concept of the present invention. Gas inlet 1108 and gas outlet 1110 can assume various shapes, sizes, types, and configurations. In some embodiments, gas inlet 1108 and gas outlet can each comprise a nozzle that is either integral with or separate from movable component 1104*a*. In some embodiments, the nozzle of gas outlet 1110 can be larger than the nozzle at gas inlet 1108.

As shown in FIG. 11, gas flow 1112 extracted through gas outlet 1110 is recirculated from gas outlet 1110 to gas inlet 1108. For example, gas flow 1112 passes through gas inlet 1108 and travels across the surface of patterning device 1102 toward gas outlet 1110. Gas outlet 1110 extracts gas flow 1112. At least one duct defines a recirculation path from gas outlet 1110 to gas inlet 1108. At that point, gas flow 1112 again passes through gas inlet 1108 and across patterning device 1102 in a continuous cycle.

In some embodiments, movable component 1104*b* comprises at least a portion of the recirculatory path. For example, as shown in FIG. 11, the recirculatory path includes an outlet duct 1114, an inlet duct 1116, and a gas flow generator 1118 spaced between the outlet duct 1114 and the inlet duct 1116. Outlet duct 1114, inlet duct 1116, and gas flow generator 1118 are positioned on movable component 1104*b*, for example, the long-stroke module.

In some embodiments, outlet duct 1114, inlet duct 1116, and gas flow generator 1118 are positioned on movable component 1104*a*, for example, the short-stroke module. For example, gas flow generator 1118 can be adjacent to gas inlet 1108 on movable component 1104*a*. And in some embodiments, at least one of outlet duct 1114, inlet duct 1116, and gas flow generator 1118 is positioned on movable component 1104*b* and at least one is positioned on movable component 1104*a*.

Gas flow generator 1118 can be any suitable device that causes the gas to flow for recirculation. For example, gas flow generator 1118 can be a gas amplifier (as discussed, for example, below with reference to FIG. 13) a pump, a fan, or any other suitable device that moves a gas.

In some embodiments in which gas flow generator 1118 is a pump, the pump is driven by one or more fans positioned on patterning device support 1100 (as discussed below with reference to FIG. 17). For example, the scanning motion of patterning device support 1100 can create an external gas flow that drives the fans which in turn drives the pump.

In some embodiments in which gas flow generator 1118 is a pump, the pump is driven by a piston. For example, the scanning motion of patterning device support 1100 can create inertia that causes the piston to move within the chamber and, in turn, drives the pump.

In some embodiments, recirculating gas flow 1112 has one or more of the following advantages over a non-recirculating gas flow: (1) recirculation reduces the amount of gas consumption, which in turn decreases the cost of ownership, decreases the supply infrastructure requirements, simplifies the duct work (which can help packaging and reliability), and decreases the required infrastructure within the lithographic apparatus to supply and extract the required volume of gas; (2) recirculation minimizes any required modifications to the illuminator to achieve the required volume for the microenvironment defined by patterning device support 1100 above patterning device 1102 if, for example, a fixed plate comprises the gas outlet; and (3) recirculation easily allows for gas flow extraction on patterning device support 1100 which in turn enables extraction closer to a surface of patterning device 1102, and provides a more uniform extraction compared to the long extraction duct required when extraction is on a fixed components, for example, the fixed purge plate.

In some embodiments, the microenvironment defined by patterning device support 1100 above patterning device 1102 is not completely sealed. For example, there can be an air gap between the patterning device support 1100 and a fixed purge plate (not shown in FIG. 11). This air gap can provide a leakage path for excess gas flow to escape. In some embodiments, an overpressure is created in the microenvironment above patterning device 1102 such that excess gas flow escaping through the air gap prevents non-conditioned gas from reaching the microenvironment. The small leakage flow can help ensure that the recirculated gas flow 1112 remains properly clean and dry.

In some embodiments, outlet duct 1114 or inlet duct 1116 comprises at least one opening that provides a leakage path for excess gas flow to escape or additional gas to be drawn in. In some embodiments, the opening in outlet duct 1114 or inflow duct 1116 is sealed with an adjustable valve. The adjustable valve can be opened when a pressure sensor (not shown) senses a predetermined pressure in outlet duct 1114 or inlet duct 1116.

In some embodiments, a gas leaked from the system can be routed to purge the elements of the projection lens and/or the illuminator, or to cool motor coils and magnets of the lithographic apparatus.

As gas flow 1112 passes across the surface of patterning device 1102, gas flow 1112 may modify the temperature of patterning device 1102. For example, gas flow 1112 can remove heat generated by radiation incident upon patterning device 1102, for example, as discussed above with respect to FIGS. 2A, 2B, 5A, and 5B. So gas flow 1112 can cool patterning device 1102 or otherwise maintain a constant temperature of patterning device 1102.

In some embodiments, outlet duct 1114 and inlet duct 1116 can each comprise one or more hoses made of any material that is clean or very clean and emits minimal molecular contamination (for example, outgassing) to the gas flow.

In some embodiments, gas flow 1112 comprises an extremely clean dry gas or air.

In some embodiments, the lithographic apparatus can include a controller 1120, for example, a processor, configured to adjust one or more characteristics of gas flow 1112, for example, temperature, flow rate, pressure, or velocity, to maintain, decrease, and/or increase the temperature of patterning device 1102. For example, controller 1120 can be operatively coupled with a temperature control element, for example, a heat exchanger, to adjust temperature of gas flow 1112, a flow control valve to adjust the pressure or flow rate of gas flow 1112, or air flow generator 1118 to control the flow rate.

In some embodiments, controller 1120 is configured for closed-loop control.

For example, in some embodiments, controller 1120 is configured to receive signals from one or more sensors configured to measure a characteristic of gas flow 1112, for example, one or more temperature sensors, one or more pressure sensors, and/or one or more flow sensors. Based on the received signal(s), controller 1120 can adjust one or more characteristics of gas flow 1112 to achieve a desired temperature of patterning device 1102. For example, controller 1120 can be configured to communicate with a temperature control element (not shown in FIG. 11), for example, a heat exchanger, to adjust the temperature of gas flow 1112, or communicate with gas flow generator 1118 to adjust the flow rate of gas flow 1112. In some embodiments, controller 1120 is configured to process other signals, for example, signals from other components of the system related to the expected dose used during exposure.

For example, as shown in FIG. 11, patterning device support 1100 comprises a temperature sensor 1119 operatively coupled with controller 1120. Temperature sensor 1119 may be configured to sense a temperature at location within the system. For example, temperature sensor 1119 may be configured to measure the temperature of patterning device 1102, the temperature of gas flow 1112 entering the environment containing pattering device 1102, the temperature of gas flow 1112 exiting the environment containing patterning device 1102, the temperature of the gas in the environment containing patterning device 1102, or any combination of these temperatures. For example, as shown in FIG. 11, temperature sensor 1119 can be positioned downstream of gas inlet 1108 in gas flow 1112 to measure the temperature of gas flow 1112 entering the environment containing pattering device 1102. In embodiments in which gas inlet 1108 or gas outlet 1110 are thermally conductive, sensor 1119 can be positioned on gas inlet 1108 or gas outlet 1110.

In some embodiments, controller 1120 can be configured to adjust one or more characteristics of gas flow 1112 based on the status of the lithographic apparatus. For example, controller 1120 can decrease the volume or velocity of gas flow 1112 and/or increase the temperature of gas flow 1112 when the lithographic apparatus is not imaging a substrate, and increase the volume or velocity of gas flow 1112 or decrease the temperature of gas flow 1112 when the system is imaging a substrate.

The skilled artisan will recognize that other variations of control are also possible that fall within the scope of the present disclosure.

Figure 12:
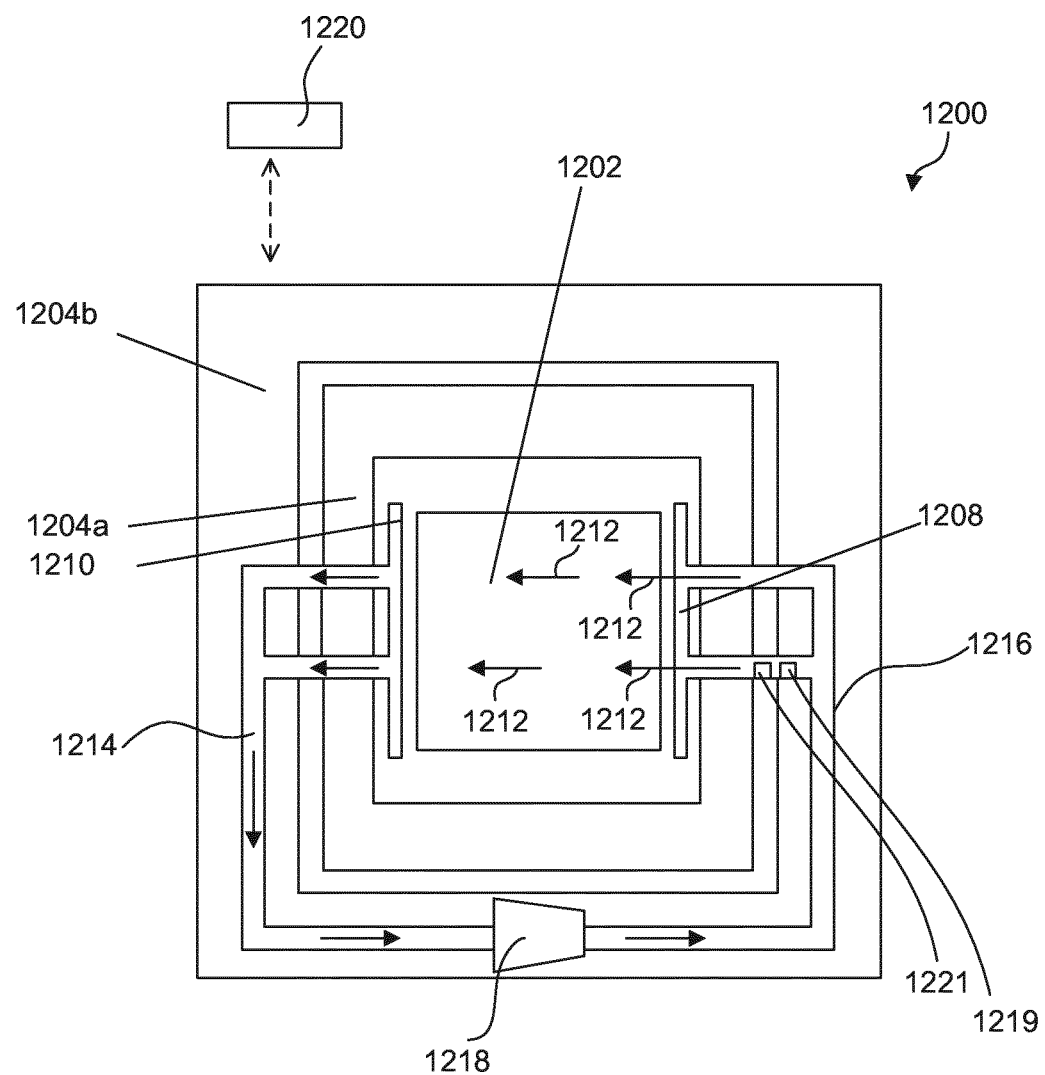
FIG. 12 is a schematic illustration of a top view of a patterning device support according to an embodiment.

FIG. 12 illustrates a top view of a patterning device support 1200 configured to control the temperature of a patterning device 1202 according to an embodiment. Patterning device support 1200 includes similar components as the above described patterning device supports, which are similarly numbered and are only described to the extent these components may differ or are helpful in explaining the disclosed embodiments. Patterning device support 1200 includes a temperature sensor 1219 and a pressure sensor 1221 positioned upstream of a gas inlet 1208. Temperature sensor 1219 and pressure sensor 1221 are operatively coupled to a controller 1220. Controller 1220 uses the signals received from temperature sensor 1219 and pressure sensor 1221 to estimate the temperature of gas flow 1212 at a location downstream of gas inlet 1208, for example, at a location proximate to a patterning device 1202.

Referring to FIGS. 11 and 12, temperature sensors 1119 and 1219 and pressure sensor 1221 may be attached to patterning device 1102 or 1202, or coupled to patterning device support 1100 or 1200 (for example, on movable component 1104a or 1204a or movable component 1104b or 1204b).

In some embodiments, controller 420 can be configured control the temperature of patterning device 402 without closed loop feedback, for example, by using calibration or a feed forward configuration.

Figure 13:
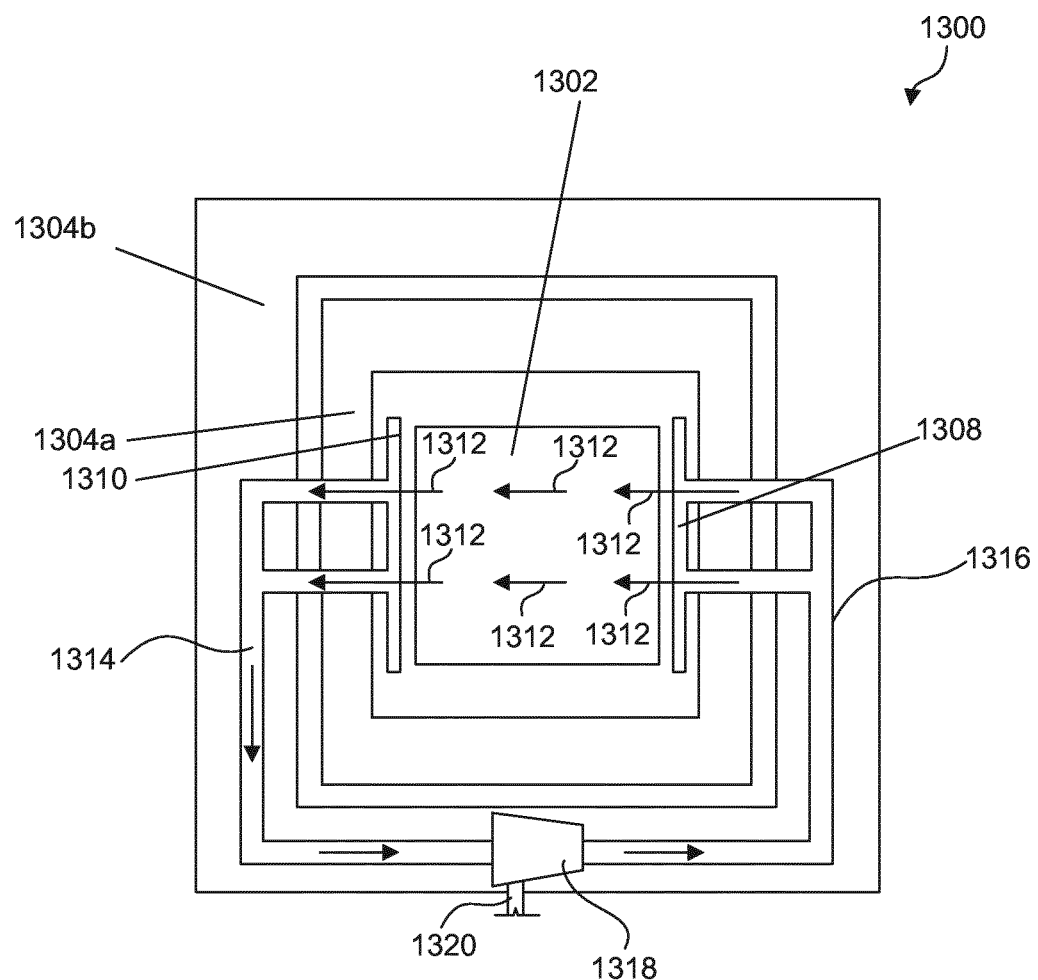
FIG. 13 is a schematic illustration of a top view of a patterning device support according to an embodiment.

FIG. 13 illustrates a top view of a patterning device support 1300 configured to control the temperature of a patterning device 1302 according to an embodiment in which the gas flow generator 1318 is a gas amplifier. Patterning device support 1300 includes similar components as the above described patterning device supports, which are similarly numbered and are only described to the extent these components may differ or are helpful in explaining the disclosed embodiments. Gas amplifier 1318 uses a high velocity stream of supply gas 1320 to move the gas flow from inlet duct 1316 to the outlet duct 1314. In some embodiments, gas amplifier 1318 can amplify the total gas flow volume by about 2 to 50 tens of times the volume of the incoming flow of supply gas 1320.

In some embodiments, one or more characteristics of supply gas 1320 can be adjusted to control the temperature of gas flow 1312 over the reticle. For example, a temperature control element, such as a heat exchanger, can be operatively coupled to supply gas as shown in FIG. 14.

Figure 14:
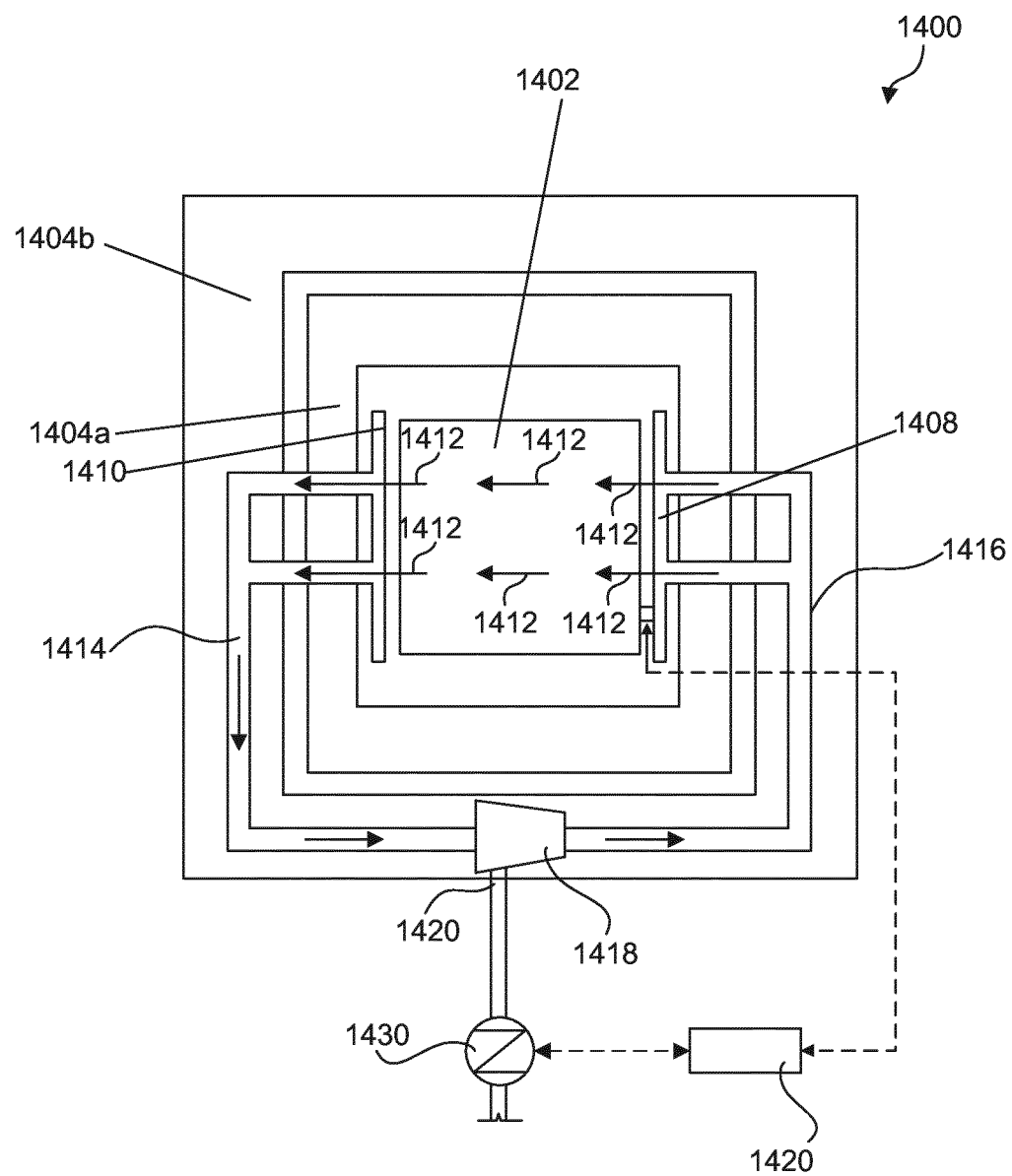
FIG. 14 is a schematic illustration of a top view of a patterning device support according to an embodiment.

FIG. 14 illustrates a top view of a patterning device support 1400 configured to control the temperature of a patterning device 1402 according to an embodiment. Patterning device support 1400 includes similar components as the above described patterning device supports. These similar components are similarly numbered and are only described to the extent they may differ or are helpful in explaining the disclosed embodiments. As shown in FIG. 14, the lithographic apparatus comprises a temperature control element 1430 configured to adjust a temperature of supply gas 1420 of gas amplifier 1418. Temperature control element 1430 can be any suitable device that changes the temperature of a gas flow. In some embodiments, a controller 1420 is operatively coupled with temperature control element 1430 to dynamically control the temperature of supply gas 1420 and, in turn, gas flow 1412 and then of patterning device 1402.

In some embodiments, one or more characteristics of the gas flow can be adjusted within the recirculatory ducts to control the temperature of the patterning device. For example, a temperature control element can be operatively coupled to a recirculatory duct to adjust the temperature of the gas flow.

Figure 15:
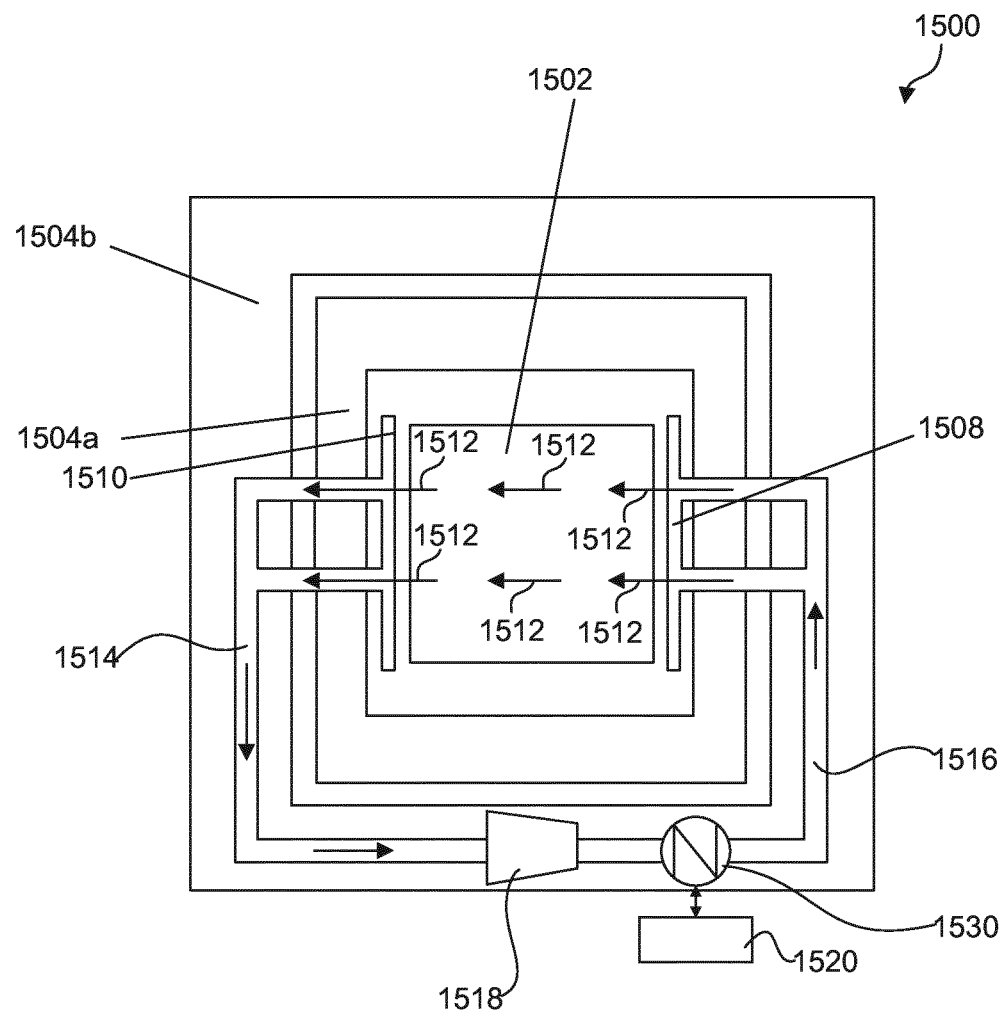
FIG. 15 is a schematic illustration of a top view of a patterning device support according to an embodiment.

FIG. 15 illustrates a top view of a patterning device support 1500 configured to control the temperature of a patterning device 1502 according to an embodiment. Patterning device support 1500 includes similar components as the above described patterning device supports. These similar components are similarly numbered and are only described to the extent they may differ or are helpful in explaining the disclosed embodiments. As shown in FIG. 15, patterning device support 1500 includes a temperature control element 1530 configured to change a temperature of the gas in the recirculatory path. For example, temperature control element 1530 can be positioned at the inlet duct 1516 downstream from gas flow generator 1518 as shown in FIG. 15. In some embodiments, a controller 1520 is operatively coupled to temperature control element 1530 to dynamically change the temperature of the gas in the recirculatory path.

Figure 16:
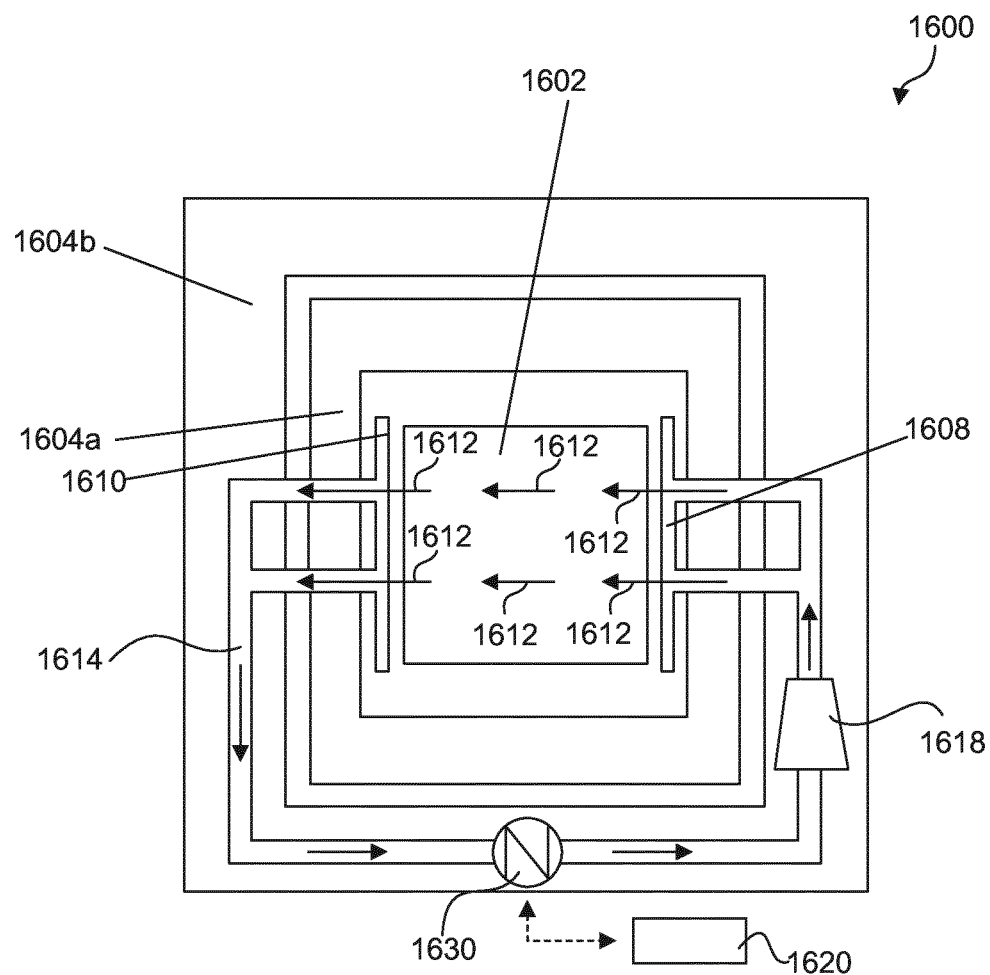
FIG. 16 is a schematic illustration of a top view of a patterning device support according to an embodiment.

FIG. 16 illustrates a top view of a patterning device support 1600 configured to control the temperature of a patterning device 1602 according to another embodiment. Patterning device support 1600 includes similar components as the above described patterning device supports. These similar components are similarly numbered and are only described to the extent they may differ or are helpful in explaining the disclosed embodiments. As shown in FIG. 16, a temperature control element 1630 can be positioned upstream from an gas flow generator 1618.

Figure 17:
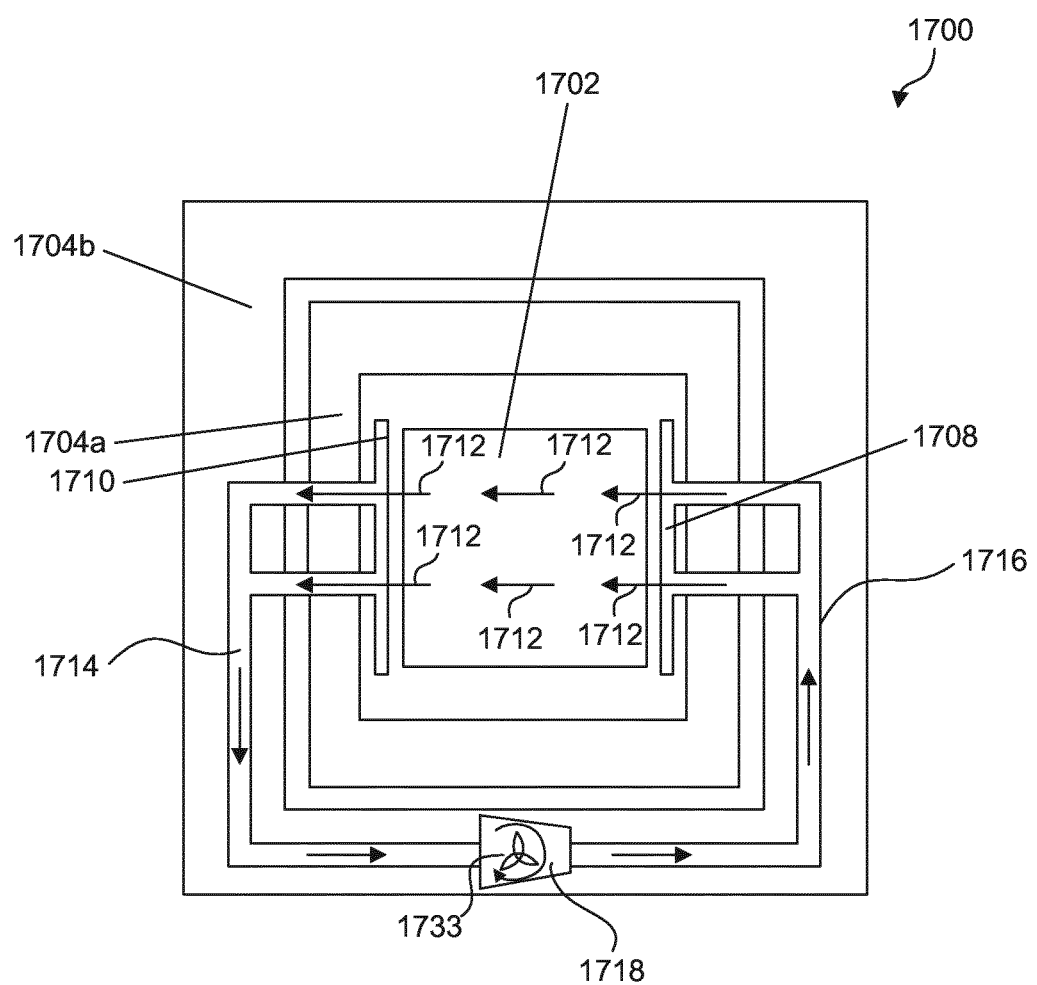
FIG. 17 is a schematic illustration of a top view of a patterning device support according to an embodiment.

FIG. 17 illustrates a top view of a patterning device support 1700 configured to control the temperature of a patterning device 1702 according to an embodiment in which the gas flow generator comprises a pump 1718. Patterning device support 1700 includes similar components as the above described patterning device supports. These similar components are similarly numbered and are only described to the extent the components may differ or are helpful in explaining the disclosed embodiments. A fan 1733 drives pump 1718. Fan 1733 is driven by the external gas flow caused by the scanning motion of patterning device support 1700.

Figure 18:
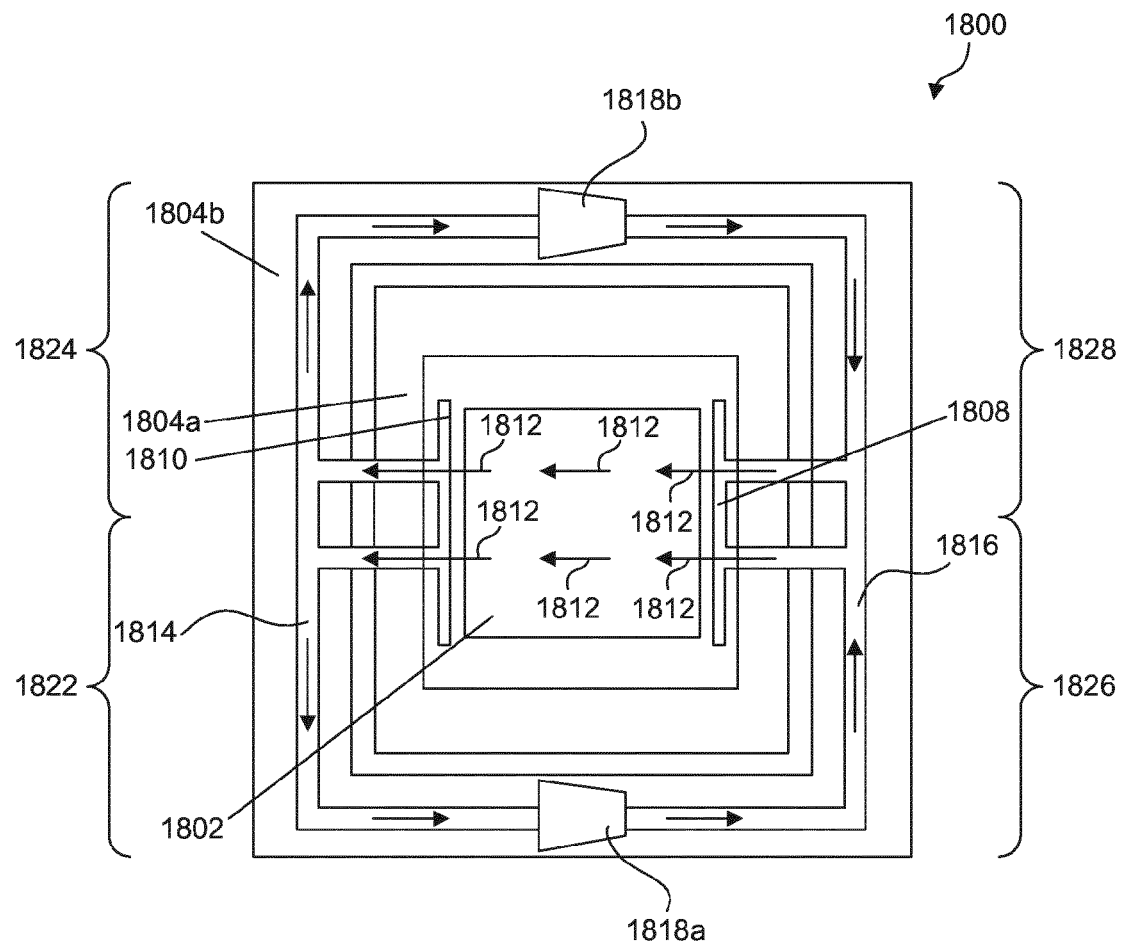
FIG. 18 is a schematic illustration of a top view of a patterning device support according to an embodiment.

FIG. 18 illustrates a top view of a patterning device support 1800 configured to control the temperature of a patterning device 1802 according to an embodiment. Patterning device support 1800 includes similar components as the above described patterning device supports. These similar components are similarly numbered and are only described to the extent they may differ or are helpful in explaining the disclosed embodiments.

In some embodiments, an outlet duct 1814 can include a first branch 1822 and a second branch 1824. First branch 1822 can direct a portion of gas flow 1812 from gas outlet 1810 to a first gas flow generator 1818a. Second branch 1824 can direct a portion of gas flow 1812 from gas outlet 1810 to a second gas flow generator 1818b. First gas flow generator 1818a can be positioned on a side of patterning device 1802 that is opposite from second gas flow generator 1818b.

In some embodiments, an inlet duct 1816 can include a first branch 1826 and an opposing second branch 1828. First branch 1826 can direct gas flow 1812 from first gas flow generator 1818a to gas inlet 1808. Second branch 1828 can direct gas flow 1812 from second gas flow generator 1818b to gas inlet 1808.

Figure 19:
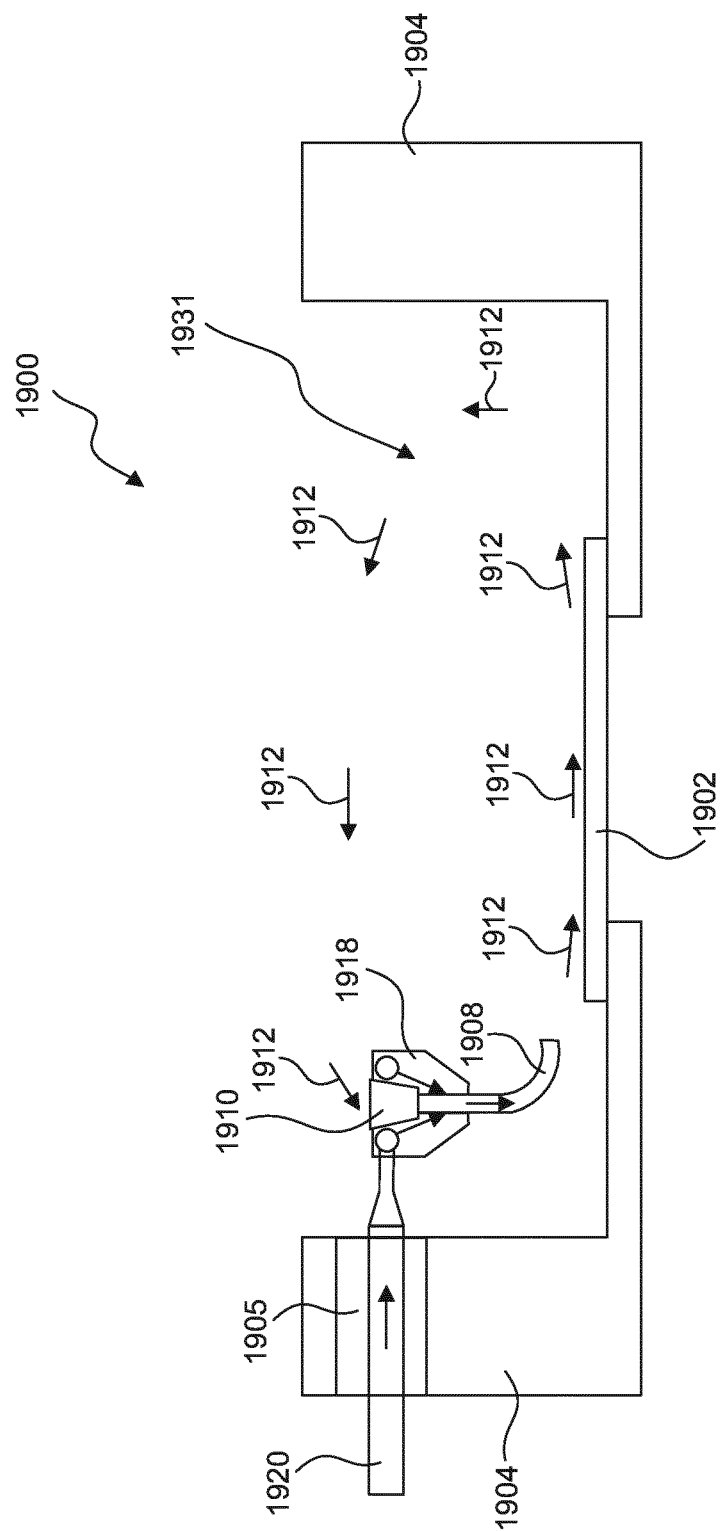
FIG. 19 is a schematic illustration of a side view of a patterning device support according to an embodiment.

FIG. 19 illustrates a side view of a patterning device support 1900 that is configured to control the temperature of a patterning device 1902 according to an embodiment. Patterning device support 1900 includes similar components as the above described patterning device supports. These similar components are similarly numbered and are only described to the extent they may differ or are helpful in explaining the disclosed embodiments. As shown in FIG. 19, patterning device support 1900 can be configured such that a gas flow 1912 recirculates within a microenvironment 1931 containing patterning device 1902. Patterning device support 1900 includes a gas amplifier 1918 positioned within environment 1931. Gas amplifier 1918 can use a high velocity stream of supply gas 1920 to push gas flow 1912 from a gas inlet 1908 in environment 1931. After exiting gas inlet 1908, gas flow 1912 travels across a surface of patterning device 1902. Movable component 1904 is shaped such that after gas flow 1912 travels across patterning device 1902 it is redirected back towards a gas outlet 1910 entirely within environment 1931. Gas amplifier 1918 can define gas outlet 1910 or can be operatively coupled to gas outlet 1910. One advantage of locally recycling gas flow 1912 within microenvironment 1931 is that external connections through movable component 1904 are minimized.

Figure 20:
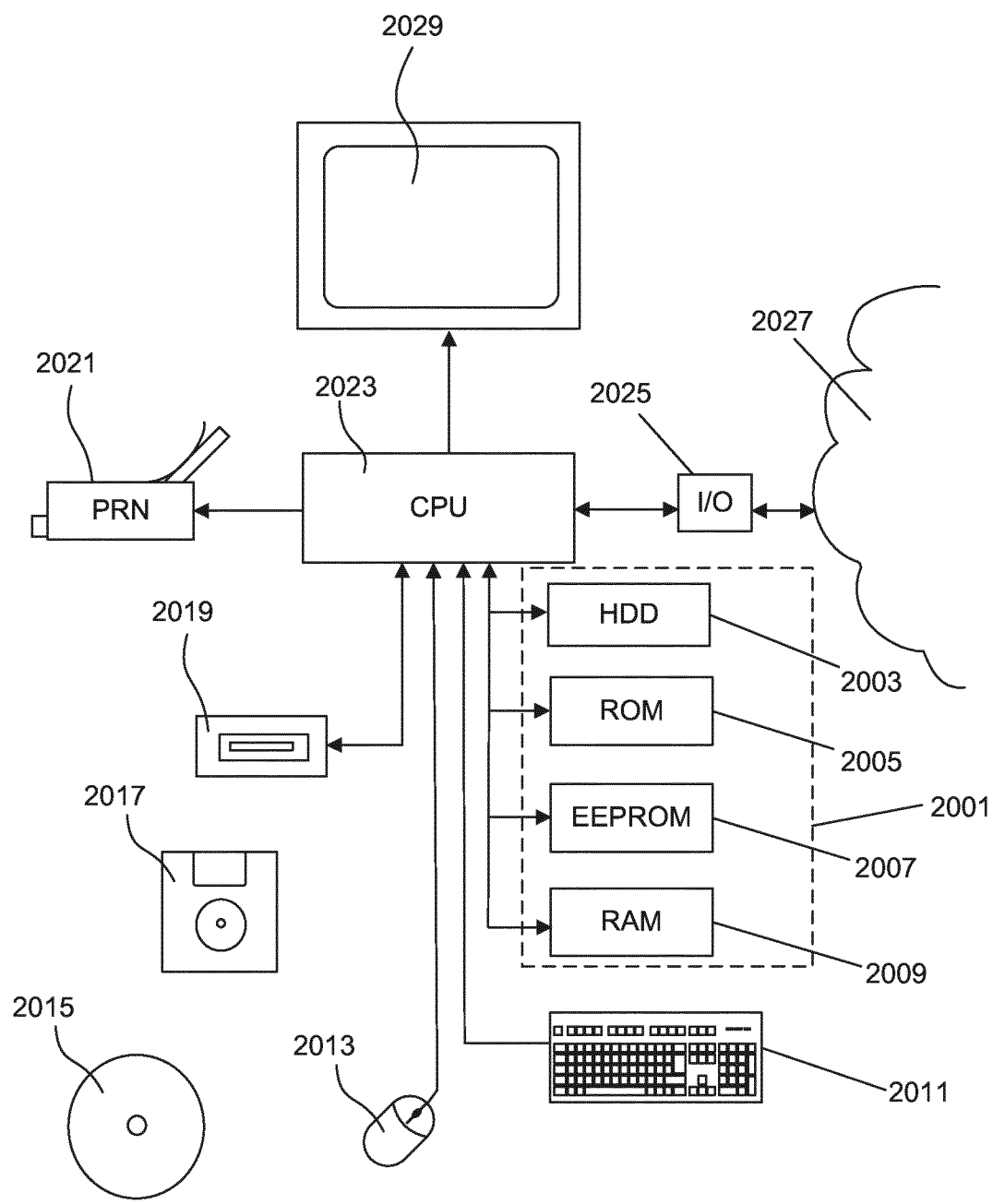
FIG. 20 illustrates computer system hardware useful in implementing the embodiments shown in FIGS. 1A through 6.

FIG. 20 illustrates computer system hardware useful in implementing the embodiments discussed in FIGS. 1A through 19. FIG. 20 illustrates a computer assembly useful as a processor configured to receive temperature data from one or more flow characteristic sensors, for example, temperature or pressure sensors, and determine how to adjust a gas flow and/or temperature of the gas in order to change or maintain the temperature of a patterning device to/at a desired level or range. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code.

A memory 2001 connected to a processor 2023 may comprise a number of memory components like a hard disk drive (HDD) 2003, Read Only Memory (ROM) 2005, Electrically Erasable Programmable Read Only Memory (EEPROM) 2007 and Random Access Memory (RAM) 2009. Not all aforementioned memory components need to be present. Furthermore, it is not essential that aforementioned memory components are physically in close proximity to the processor 2023 or to each other. They may be located at a distance away from each other.

The processor 2023 may also be connected to some kind of user interface, for instance a keyboard 2011 or a mouse 2013. A touch screen, track ball, speech converter or other interfaces that are known to persons skilled in the art may also be used.

The processor 2023 may be connected to a reading unit 2019, which is arranged to read data, e.g., in the form of computer executable code, from and under some circumstances store data on a data carrier, like a floppy disc 2017 or an optical disk 2015.

DVDs, flash memory, or other data carriers known to persons skilled in the art may also be used.

The processor 2023 may also be connected to a printer 2021 to print out output data on paper as well as to a display 2029, for instance a monitor or LCD (Liquid Crystal Display), or any other type of display known to a person skilled in the art.

The processor 2023 may be connected to a communications network 2027, for instance a public switched telephone network (PSTN), a local area network (LAN), a wide area network (WAN) etc. by means of transmitters/receivers 2025 responsible for input/output (I/O). The processor 2023 may be arranged to communicate with other communication systems via the communications network 2027. In an embodiment of the invention external computers (not shown), for instance personal computers of operators, can log into the processor 2023 via the communications network 2027.

The processor 2023 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 2023 may even be located a distance away from the other processing units and communicate via communications network 2027. Connections between modules can be made wired or wireless.

The computer system can be any signal processing system with analogue and/or digital and/or software technology arranged to perform the functions discussed here.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system to control a temperature of a patterning device in a lithographic apparatus, the patterning device having a first surface with first and second ends, the system comprising:
   a patterning device support comprising:
   a movable component configured to support the patterning device and to move during operational use, the movable component defining a first opening adjacent the first end of the first surface of the patterning device;
   a gas inlet configured to provide a gas flow across the first surface of the patterning device, the gas inlet passing through the first opening of the movable component and having an opening adjacent the first end of the first surface of the patterning device; and
   a gas outlet having an opening configured to extract the gas flow, the opening of the gas outlet being adjacent the second end of the first surface of the patterning device;
   wherein the gas inlet and the gas outlet are configured such that the gas flow is substantially parallel to the first surface of the patterning device, and wherein the gas flow affects the temperature of the patterning device.

2. The system of claim 1, further comprising a gas supply operatively coupled to the gas inlet to supply the gas flow to the gas inlet.

3. The system of claim 1, further comprising:
   a temperature sensor configured to determine a temperature of at a location within the system; and
   a controller operatively coupled to the temperature sensor to control a characteristic of the gas flow and thereby achieve a desired temperature of the patterning device.

4. The system of claim 3, wherein the controller is configured to dynamically adjust the characteristic of the gas flow to achieve the desired temperature of the patterning device.

5. The system of claim 3, wherein the characteristic is a temperature, pressure, or flow rate of the gas flow.

6. The system of claim 1, wherein:
   the gas inlet comprises a gas supply nozzle having a length that approximates a length of the patterning device, and
   the gas outlet comprises a gas extraction nozzle having a length that approximates the length of the patterning device.

7. The system of claim 6, wherein the gas supply nozzle comprises a plurality of holes along the length of the gas supply nozzle.

8. The system of claim 6, wherein the gas extraction nozzle comprises a plurality of holes along the length of the gas extraction nozzle.

9. The system of claim 6, wherein at least one of the gas supply nozzle and the gas extraction nozzle comprises a temperature control element.

10. The system of claim 9, wherein the temperature control element comprises cooled water or a thermoelectric cooling element.

11. The system of claim 1, wherein the first surface of the patterning device is a top surface of the patterning device.

12. The system of claim 1, wherein the movable component is a short stroke module configured to move the patterning device.

13. The system of claim 1, wherein the gas flow comprises helium.

* * * * *